(12) United States Patent
Mkadem et al.

(10) Patent No.: US 9,191,041 B2
(45) Date of Patent: Nov. 17, 2015

(54) DIGITAL PREDISTORTION OF WIDEBAND POWER AMPLIFIERS WITH REDUCED OBSERVATION BANDWIDTH

(71) Applicant: Telefonaktiebolaget LM Ericsson (publ), Stockholm (SE)

(72) Inventors: Farouk Mkadem, Kitchener (CA); Slim Boumaiza, Waterloo (CA)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 14/362,213

(22) PCT Filed: May 28, 2014

(86) PCT No.: PCT/IB2014/061792
§ 371 (c)(1),
(2) Date: Jun. 2, 2014

(87) PCT Pub. No.: WO2014/195830
PCT Pub. Date: Dec. 11, 2014

(65) Prior Publication Data
US 2015/0194989 A1    Jul. 9, 2015

Related U.S. Application Data

(60) Provisional application No. 61/831,459, filed on Jun. 5, 2013.

(51) Int. Cl.
*H04K 1/02* (2006.01)
*H04B 1/04* (2006.01)
*H03F 1/32* (2006.01)
*H04B 1/62* (2006.01)

(52) U.S. Cl.
CPC ............ *H04B 1/0475* (2013.01); *H03F 1/3247* (2013.01); *H04B 1/62* (2013.01); *H04B 2001/0425* (2013.01)

(58) Field of Classification Search
CPC . H04B 1/0475; H04B 1/62; H04B 2001/0425
USPC .......................................................... 375/297
See application file for complete search history.

(56) References Cited

U.S. PATENT DOCUMENTS

| | | | |
|---|---|---|---|
| 7,289,575 B1 * | 10/2007 | Kenington | 375/296 |
| 7,769,103 B2 * | 8/2010 | Carichner et al. | 375/296 |
| 2003/0179829 A1 * | 9/2003 | Pinckley et al. | 375/295 |
| 2004/0246048 A1 * | 12/2004 | Leyonhjelm et al. | 330/2 |

(Continued)

OTHER PUBLICATIONS

Mkadem, "Systematic pruning of Volterra series using Wiener G-functionals for power amplifier and predistorter modeling" 2011 European Microwave Integrated Circuits Conference (EuMIC), Oct. 10-11, 2011 pp. 482-485.*

(Continued)

*Primary Examiner* — Juan A Torres
(74) *Attorney, Agent, or Firm* — Christopher & Weisberg, P.A.

(57) ABSTRACT

A method and power amplification system for achieving digital pre-distortion of wideband, power amplifiers with reduced observation bandwidth are disclosed. A digital pre-distorter system uses a reduced transmitter observation receiver bandwidth combined with a high transmit path sampling rate to linearize a power amplifier across a broad spectrum that may extend to beyond about five times a bandwidth of a signal input to the system.

14 Claims, 19 Drawing Sheets

(56) References Cited

U.S. PATENT DOCUMENTS

| | | | |
|---|---|---|---|
| 2005/0242876 A1 | 11/2005 | Obernosterer | |
| 2006/0217083 A1* | 9/2006 | Braithwaite | 455/114.3 |
| 2008/0032642 A1 | 2/2008 | Singerl et al. | |
| 2010/0134333 A1 | 6/2010 | Hagmanns | |
| 2011/0210789 A1* | 9/2011 | Ohkawara et al. | 330/149 |
| 2012/0200355 A1* | 8/2012 | Braithwaite | 330/147 |
| 2013/0077713 A1* | 3/2013 | Kim et al. | 375/297 |
| 2014/0161207 A1* | 6/2014 | Teterwak | 375/297 |
| 2015/0016567 A1* | 1/2015 | Chen | 375/297 |

OTHER PUBLICATIONS

Braithwaite, "Digital predistortion of a power amplifier for signals comprising widely spaced carriers," Microwave Measurement Symposium (ARFTG), 2011 78th ARFTG, 2011.*

Singerl, "A low-rate identification method for digital predisorters based on Volterra kernel interpolation," 48th Midwest Symposium on Circuits and Systems, 2005, pp. 1533-1536 vol. 2.*

International Search Report and Written Opinion dated Sep. 29, 2014 for International Application No. PCT/IB2014/061792, International Filing Date: May 28, 2014 consisting of 9-pages.

\* cited by examiner

DIGITAL PREDISTORTION OF WIDEBAND POWER AMPLIFIERS WITH REDUCED OBSERVATION BANDWIDTH

TECHNICAL FIELD

The present invention relates to a method and system for digital pre-distortion of wideband, power amplifiers with a reduced transmitter observation receiver bandwidth.

BACKGROUND

The quest for ubiquitous and broadband wireless access is driving the deployment of wideband signals with high peak-to-average power ratios (PAPRs). These signals pose several challenges to efficiency and linearity in radio frequency (RF) transmitters, particularly within the power amplifier (PA) stage. This is mainly attributed to the intensification of the distortion effects due to the static nonlinearity and memory effects (MEs) exhibited by a PA as the bandwidth and PAPR grow. Digital pre-distortion (DPD) techniques are often used to mitigate distortions exhibited by PAs. As shown in FIG. 1, the goal of a DPD engine 12 is to pre-distort the input signal to compensate for the distortion caused by a power amplifier 14 so that the output of the power amplifier 14 is an accurate amplified version of the input signal. These DPD techniques have succeeded to a great extent in improving the achievable PA linearity versus power efficiency trade-off.

Nonlinear PA behavioral models and DPD schemes have been classified into two categories: memory-less models and models with memory. The application of memory-less models/DPDs has been limited to narrow band scenarios where the distortions are mainly attributable to a transistor's static nonlinearity. However, as the bandwidth of input signals has broadened, PA models/DPDs developed into more comprehensive, nonlinear, and memory-capable modeling schemes capable of accounting for both MEs and static nonlinearity.

Spurred by the Volterra series, a number of PA models/DPDs with memory have been devised to reduce implementation burden. These include the dynamic derivation reduction (DDR) based Volterra series, generalized memory polynomial (GMP) methods and the memory polynomial model. Yet, the complexity of the previously mentioned DPD schemes escalates as the bandwidth of the deployed signal broadens, rendering their practical implementation exceedingly challenging. The problems extend to three different components of the DPD system 15, as shown in FIG. 2 namely:
- the digital predistortion engine 16;
- the digital predistortion parameters identifier 18; and
- the transmitter observation receiver 20.

Deployment of wideband signals necessitates the use of high speed DPD engines 16, and digital to analog converters (DACs) 22. In addition, these signals require a transmitter observation receiver (TOR) 20 with RF-to-IF frequency conversion module 30, band pass filter 34 and high-speed analog to digital converters (ADC) 24. The high sampling rate of the ADC 24 of at least 5 times the input Nyquist rate (5×INR) of the input signal bandwidth was believed to be required for capturing accurate measurement data for the identification of the DPD parameters and linearization capability. The significant power and cost overheads of high-speed ADCs, DACs, and DPD processing engines bring down the overall efficiency of the DPD+PA cascade and limits the usefulness of the DPD for enhancing the trade-off between efficiency and linearity.

The system 15 of FIG. 2 also includes an up-converter 26 that up-converts the analog output of the DAC 22 to RF, and a power amplifier 28 that amplifies the up-converted analog signal. In the TOR 20, a first down converter 30 down converts the RF power amplifier output to an intermediate frequency IF, a second down converter 32 to convert the IF signal to baseband. In some cases, a band pass filter 34 filters the power amplifier output, which defines the observation bandwidth of the TOR 20, and is added to reject any potential aliasing.

Several attempts have been reported to relax the transmitter observation receiver (TOR) bandwidth and consequently, the required analog to digital converter sampling rate in the TOR, and to alleviate the complexity of the DPD implementation as the signal bandwidth broadens. The generalized sampling theorem (GST) has been used to reconstruct the output signal of a nonlinear system using a TOR with reduced bandwidth. The GST calls for an additional function which is used to reduce the bandwidth of the PA output signal as well as inversing the nonlinear system behavior. According to some, the application of the GST in PA behavioral modeling problems requires a priori knowledge of its corresponding DPD function so that the PA output signal can be sampled using the input Nyquist rate (INR), i.e., twice the input signal bandwidth, rather than the output Nyquist rate (ONR), i.e., twice the output signal bandwidth. However, the a priori knowledge of the precise DPD is practically unattainable.

A band-limited Volterra series model to restrict the linearization application to the available observation path bandwidth has also been proposed. Using the band-limited Volterra series, it has been shown that linearization was successful within the observation band of the TOR. The residual spectrum regrowth introduced by the PA outside the observation bandwidth and not tackled by the band-limited Volterra series DPD is mitigated using a sharp band-pass filter (BPF) at the output of the power amplifier. The high-order of the BPF would imply non-negligible insertion loss, which should be included in order to carefully assess the potential performance degradation. However, the band-limited Volterra DPD does not allow for complete linearization of PA output intermodulation distortions (IMDs).

SUMMARY

The present invention advantageously provides a method and system for achieving digital pre-distortion of wideband, power amplifiers with reduced observation bandwidth. According to one aspect, the invention provides a method of generating digital pre-distorter, DPD, parameters. The method includes iteratively updating parameters of a digital pre-distorter, DPD. The method includes generating a DPD output signal based on a modulated input signal, the DPD using a set of parameters. The DPD output signal is converted to an analog signal using a digital-to-analog converter operating at a rate of at least 5 times a Nyquist rate of the modulated input signal. The digital-to-analog converter produces an analog output signal that is amplified by a power amplifier to produce a power amplifier output signal. The envelope of the power amplifier output is sampled in a transmitter observation receiver, TOR, at a rate that is less than about 2.5 times the Nyquist rate of the modulated input signal to produce an observation signal. A next set of parameters of the DPD is generated via a DPD parameter determiner. The next set of parameters of the DPD is derived from the observation signal and the DPD output signal.

According to this aspect, in some embodiments, generation of subsequent parameters of the DPD is continued iteratively until a desired amount of linearization of a response of the power amplifier is achieved. In some embodiments, generation of subsequent parameters of the DPD is continued iteratively until linearization of the response of the power amplifier without substantial spectral regrowth throughout a frequency band defined by more than twice the bandwidth of the modulated input signal is achieved. In some embodiments, a spectrum of the power amplifier output is band limited in the TOR to about twice the bandwidth of the modulated input signal. In some embodiments, the band limited envelope of the power amplifier output signal is sampled at a rate that is about twice the Nyquist rate of the modulated input signal. In some embodiments, the digital-to-analog converter is operated at a sample rate that is at least 5 times the Nyquist rate of the modulated input signal.

According to another aspect, a method of generating digital pre-distortion, DPD, function parameters for pre-distortion of input signals of a power amplifier having a non-linear behavior is provided. A digital pre-distorter is initialized to operate with an initial set of DPD function parameters. The digital pre-distorter is excited with a modulated input signal having a bandwidth to produce a DPD output signal having distortion lying within and outside a frequency range defined by the bandwidth of the modulated input signal. The DPD output signal is converted to an analog signal via a digital-to-analog converter operating at a sample rate of at least 5 times a Nyquist rate of the modulated input signal. The analog signal is up-converted to RF. The up-converted analog signal is amplified via the power amplifier to produce a power amplifier output signal. An observation signal is produced in a transmitter observation receiver, TOR, based on the power amplifier output. The observation signal is sampled at a rate that is about 2 times the Nyquist rate of the modulated input signal. The observation signal is up-sampled to match a sampling rate of the DPD output signal. Subsequent DPD function parameters are generated based on the up-sampled observation signal and the DPD output signal.

According to this aspect, the steps may be repeated until a subsequent set of DPD function parameters yields a digital pre-distorter response that substantially approximates an inverse of a non-linear response of the power amplifier. In such embodiments, upon yielding the DPD response, the digital pre-distorter, the power amplifier and the transmitter observation receiver are placed in operation to continuously pre-distort subsequent input signals. In some embodiments, the digital pre-distorter is initialized by applying an input comprising multiple discrete tones. The multiple discrete tones may be unevenly spaced. In some embodiments, the method may further include band limiting, via the TOR, a spectrum of the power amplifier output to produce an observation signal having a bandwidth about twice the bandwidth of the input signal. In some embodiments, the TOR has an analog to digital converter that operates at a sample rate that is about twice the Nyquist rate of the modulated input signal.

According to another aspect, the invention provides a power amplification system that includes a digital pre-distorter engine configured to pre-distort a modulated input signal having a first bandwidth and to produce a digital pre-distorter output signal having distortion lying within and outside a frequency range defined by the first bandwidth. The power amplification system further includes a digital-to-analog converter operating a sampling rate of at least 5 times a Nyquist rate of the modulated input signal to produce an analog signal. An up-converter is configured to up-convert the analog signal. A power amplifier is configured to amplify the RF signal to produce a power amplifier output signal, where the power amplifier output signal has a nonlinear amplification of the digital pre-distorter output signal. The power amplification system also includes a transmitter observation receiver having an analog to digital converter configured to operate at a sampling rate that is about 2 times a Nyquist rate of the modulated input signal to produce an observation signal. An up-sampler is configured to up-sample the observation signal to match a sampling rate of the digital pre-distorter. A parameter determiner is configured to determine parameters of the digital pre-distorter based on the observation signal and on an output of the digital pre-distorter.

According to this aspect, in some embodiments, the digital pre-distorter is pre-configured by initializing the digital pre-distorter to operate with an initial set of DPD function parameters. In some embodiments, the initial set of DPD function parameters are based on G-functionals. The G-functionals may be used to prune a Volterra series. In some embodiments, the process of feeding back the determined parameters to the digital pre-distorter continues so that the response of the power amplifier is linearized over a frequency band that is more than twice the first bandwidth. In some embodiments, the process of feeding back the determined parameters to the digital pre-distorter continues so that the response of the power amplifier is linearized over a frequency band that is about five times the first bandwidth.

According to another aspect, the invention provides a power amplification system that includes a digital pre-distorter, DPD, configured to generate a DPD output signal based on a modulated input signal. The DPD initially uses a set of first DPD parameters. A digital-to-analog converter operates at a sampling rate that is about 5 times a Nyquist rate of the modulated input signal and is configured to sample the DPD output signals to produce an analog signal. A power amplifier is configured to amplify the analog signal to produce a power amplifier output signal. A transmitter observation receiver, TOR, is configured to sample the power amplifier output signal at a rate that is about 2 times the Nyquist rate of the modulated input signal to produce an observation signal. A DPD parameter generator is configured to generate a next set of DPD parameters based on the observation signal and the DPD output signal.

According to this aspect, in some embodiments, the next set of DPD parameters are updated and coupled to the DPD iteratively so that linearization of the power amplifier is achieved over a frequency band that is about 2 times the bandwidth of the modulated input signal. In some embodiments, the transmitter observation receiver is configured to band limit a spectrum of the power amplifier to an observation bandwidth that is about equal to twice the bandwidth of the modulated input signal.

DETAILED DESCRIPTION

Figure 1:
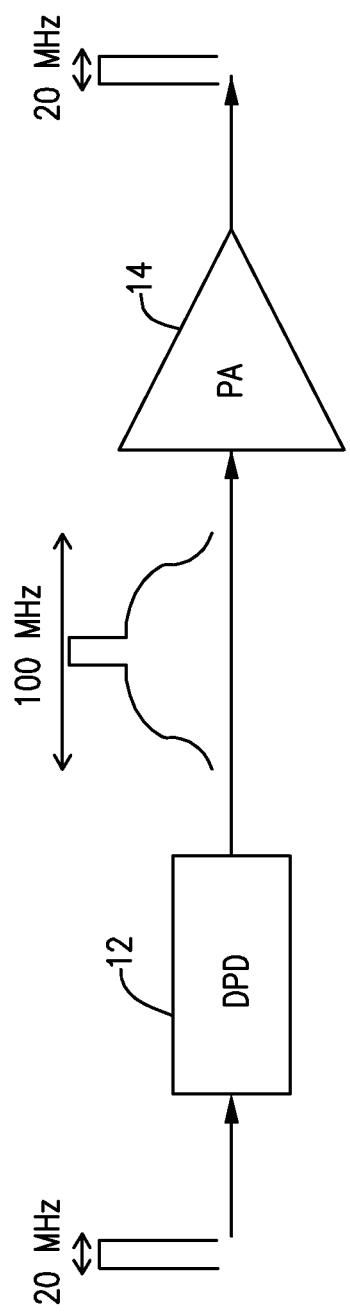
FIG. 1 is an illustration of a DPD/power amplifier (PA) cascade showing compensation of distortion of the PA via the DPD.

Before describing in detail exemplary embodiments that are in accordance with the present invention, it is noted that the embodiments reside primarily in combinations of apparatus components and processing steps related to digital pre-distortion of wideband power amplifiers with reduced observation bandwidth. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

In the approach described herein it is shown that to compensate for the nonlinearity exhibited by wideband PAs, the correct pre-distorted signal can be accurately synthesized using a fraction of the bandwidth occupied by the PA output signal. The approach does not rely on the GST, yet reduces the bandwidth of the TOR without compromising the linearization capability of the power amplification system that includes the DPD. The theoretical and experimental analysis described herein reveals a robust and accurate linearization of the PA output when the bandwidth of the TOR is set to twice the modulation bandwidth of the input signal. The approach described herein utilizes the Volterra series, pruned using G-functionals to model a DPD engine. This process is explained by F. Mkadem, D. Y. Wu, and S. Boumaiza, "Wiener G-Functionals for Nonlinear Power Amplifier Digital Predistortion," IEEE MTT 2012 International Microwave Symposium, Montreal, QC, Canada.

Figure 2:
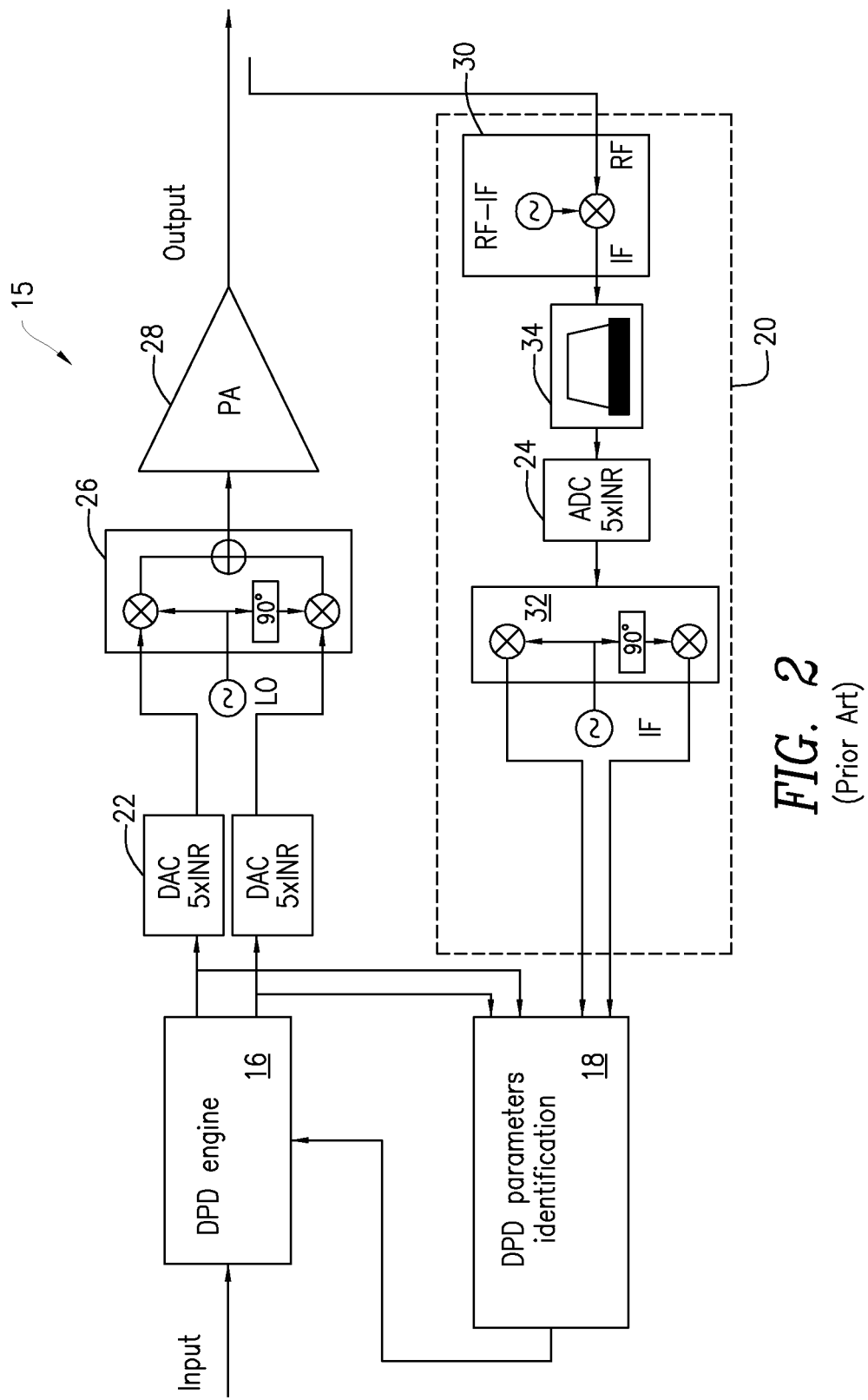
FIG. 2 is a block diagram of a basic structure of a digital pre-distorter (DPD) that may be modified in accordance with principles of the present invention.
Figure 3:
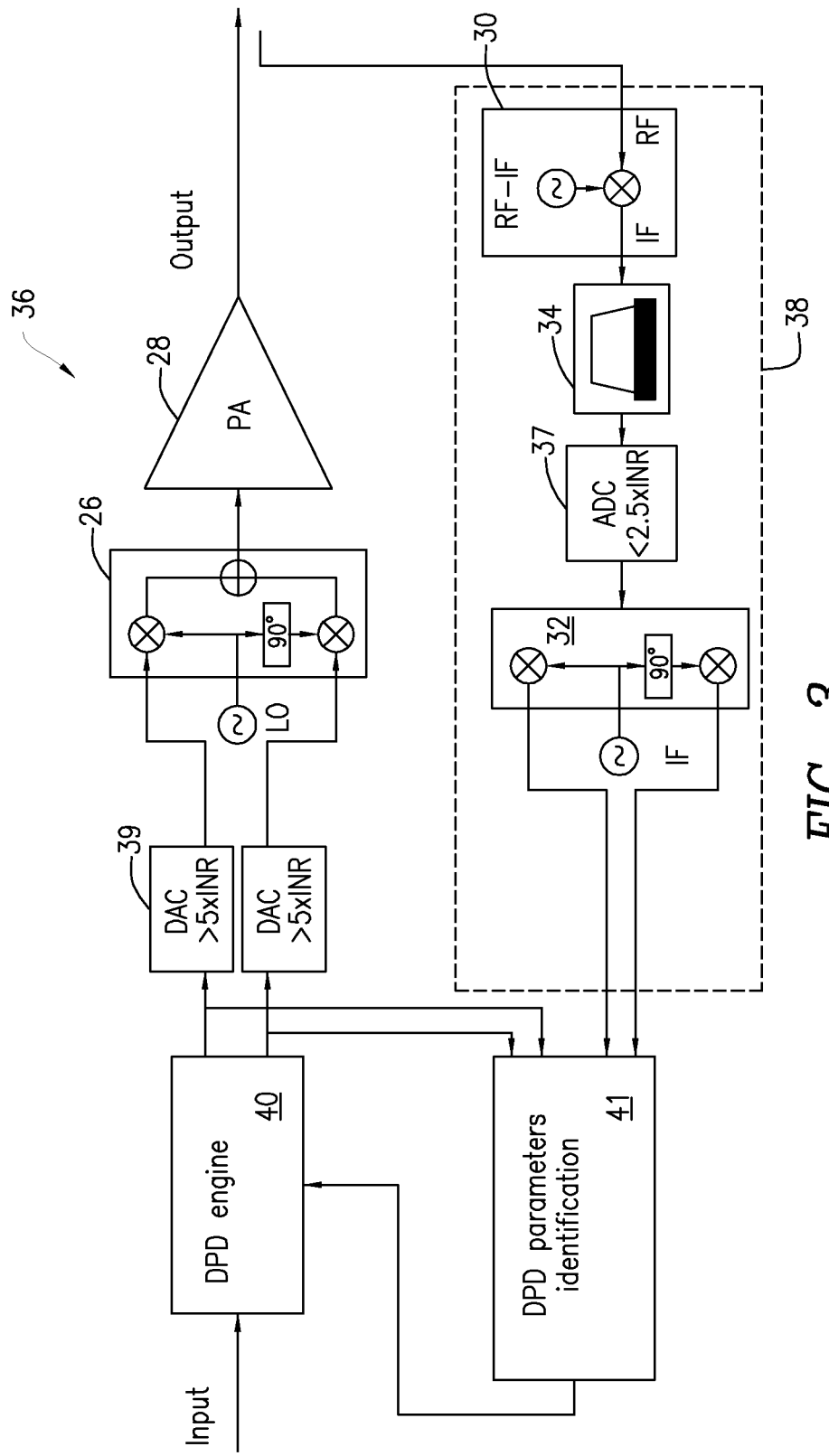
FIG. 3 is a block diagram of a DPD modified in accordance with principles of the present invention.

FIG. 3 is a block diagram of a DPD architecture 36 constructed according to principles of the present invention. The architecture 36 of FIG. 3 shares some of the same components as the DPD architecture 15 of FIG. 2. A difference is that embodiments herein allow the ADC 37 of the TOR 38 of FIG. 3 to sample at a rate of about twice the input signal Nyquist rate (2×INR), rather than 5×INR, as shown in FIG. 2, while the sample rate of the DACs 39 can remain high, at least 5×INR. Another difference is that the DPD engine 40 and DPD parameters identifier 41 implement a DPD model derived from a Volterra series that is pruned using G-functionals to reduce model complexity and to identify a proper set of kernels needed to form the inverse of the PA. As discussed below, as compared with known implementations, embodiments herein produce improved linearization over a bandwidth that may exceed five times or more the bandwidth of the input signal. This is achieved with a TOR bandwidth that is less than or equal to about 2 to 2.5 times the bandwidth of the input signal while maintaining a high sampling rate in the transmit path of at least 5 times the input Nyquist rate (S×INR).

The feasibility and efficacy of the sampling rate scheme of FIG. 3 can be demonstrated as follows. Consider a PA with a static nonlinear transfer function as given in equation (1), where x(n) and y(n) are the PA input and output signals respectively, P is the nonlinearity order, and $a_i$ are the known memory-less parameters of the PA model. Since only the nonlinearity order dictates the bandwidth expansion, a memory-less model was selected for simplicity instead of a model with memory effect. Initially, for reasons of clarity, the nonlinearity order is set to 3 (i.e., P=3). The results can be generalized to any order of nonlinearity.

$$y(n) = \sum_{p=0}^{\frac{P-1}{2}} a_{2p+1} |x(n)|^{2p} x(n) \tag{1}$$

Using the $p^{th}$-order inverse, equation (1) suggests that the DPD model can be expressed as in equation (2), where $b_i$ are unknown memory-less parameters and u(n) is the input signal.

$$x(n) = \sum_{p=0}^{\frac{P-1}{2}} b_{2p+1} |u(n)|^{2p} u(n) \qquad (2)$$

Figure 4:
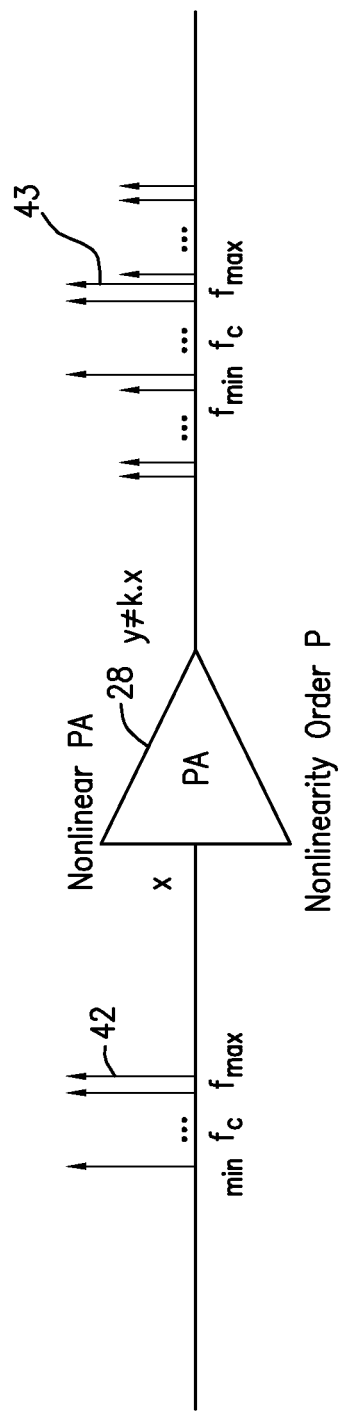
FIG. 4 illustrates distortion of a multi-tone signal by a nonlinear PA.
Figure 5:
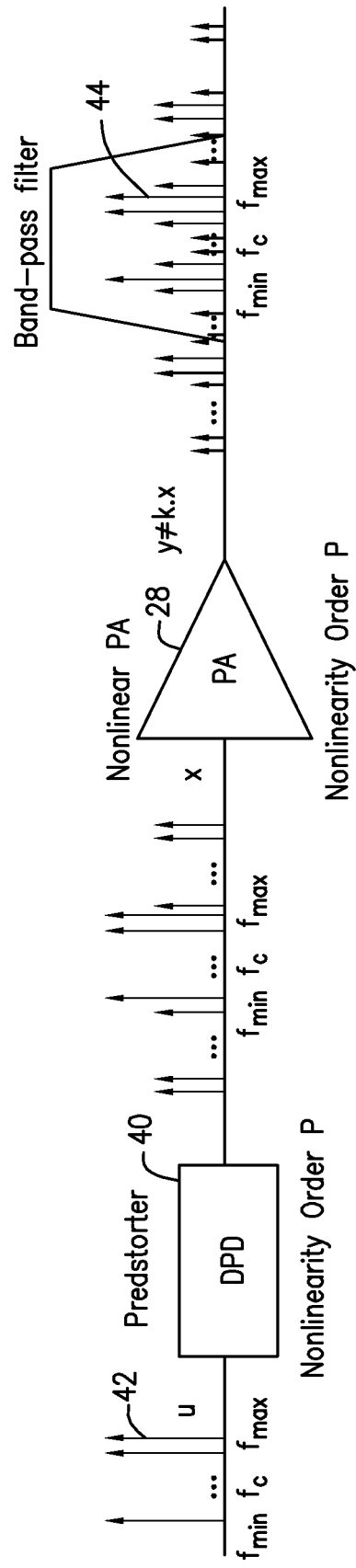
FIG. 5 illustrates pre-distortion of a multi-tone signal by a DPD and distortion of the DPD output by a nonlinear PA when the DPD does not completely compensate for the non-linearity of the PA.

In order to identify the DPD model's unknown parameters, (i.e., $b_i$) when P=3, at least two independent equations are needed (i.e., one for each unknown value). FIGS. 4 and 5 illustrate the frequency domain of the PA's input and output signals, without and with the presence of a DPD. FIG. 4 shows discrete tones 42 input to a power amplifier 28 which outputs the input tones plus additional tones 43 generated in the power amplifier 28. FIG. 4 suggests that one of the equations for identifying $b_i$ can be deduced from the nonlinear amplification of the fundamental tones. A second equation can be determined by the identification of the third order inter-modulation distortions (IMD3) generated at the output of the PA. Hence, measurement of the IMD3 is required when P=3 to identify the DPD parameters (i.e., $b_i$). The same conclusions remain true for any nonlinearity order. For example, for P=7, measurement of IMD3, IMD5 and IMD7 may be needed to fully determine the DPD model parameters when driven by a multi-tone signal; in other words, five equations. However, in practice, while the nonlinearity order of the DPD model is usually set higher than 5, only IMD3 and IMD5 may be captured to identify the DPD parameters.

Returning to the case of P=3, FIGS. 4 and 5 show that the output signal bandwidth is larger than the input due to the PA nonlinearity that generates IMDs in both cases. However, the same figures show a major difference in the location of the IMDs at the PA output signal. FIG. 4 shows that all IMD3 are generated outside of the output in-band signal: $[f_{min} \ldots f_{max}]$, where $f_{min}$ and $f_{max}$ are the smallest and highest frequency amplified tones respectively. FIG. 5, however, shows that even though the PA nonlinearity is only 3, up to 5 times the input bandwidth is observed at the output 44 of the PA 28 and the IMDs' location is now in both the in-band and out-of-band regions (i.e., inside and outside $[f_{min} \ldots f_{max}]$).

The presence of IMDs inside the output signal in-band region is due to the presence of tones outside the $[f_{min} \ldots f_{max}]$ band at the input of the PA. The latter tones generate in-band IMDs at the output of the PA when passing through the nonlinear PA. Therefore, by only measuring the in-band output signal (the amplified multi-tone and the in-band IMDs), more than one independent equation can be deduced. In other words, with an observation of only the in-band output signal, all $b_i$ can be identified and a DPD model can be computed. This allows for a reduction of the TOR bandwidth at the output of the PA.

Theoretically, with a large enough number of tones, only in-band observation would be required to characterize the PA nonlinearity and to identify the DPD parameters. This is due to the large number of IMDs generated in the output in-band region which provide a large number of independent equations to identify the DPD parameters, $b_i$. However, in practice, this is not sufficient and an observation of twice the input signal bandwidth may be needed.

Simulations with multi-tone signals were performed to demonstrate the validity of identifying a DPD model with reduced TOR bandwidth. In the proposed model, the output signal is captured by a receiver with a bandwidth equal to twice the input signal bandwidth. This is a considerable reduction of the TOR bandwidth from five times to only two times the input signal bandwidth. Several iterations were used to identify the DPD parameters when using the reduced TOR bandwidth. As is discussed below, in a practical implementation, the TOR may be operated at twice the input signal Nyquist rate (2×INR) rather than one times the output Nyquist rate (ONR=5×INR).

To verify the proposition that reduced TOR bandwidth may result in adequate linearization, a simulation case study of a memory-less nonlinear PA configuration was conducted using an input signal having three uniformly spaced tones. In one case, the nonlinearity of the model was set equal to 9 and even and odd orders were used. The model is given in equation (3):

$$y(n) = \sum_{p=0}^{8} a_p |x(n)|^p x(n) \qquad (3)$$

$a_1 = -0.56 + 0.84i$ $a_2 = -1.14 + 0.57i$ $a_3 = 15.94 - 8.80i$ $a_4 = -95.11 + 50.22i$ $a_5 = 303.09 - 136.99i$ $a_6 = -550.68 + 202.02i$ $a_7 = 575.1 - 168.66i$ $a_8 = -321.89 + 76.1i$ $a_9 = 74.9 - 14.66i$

Note that the frequency components which were far from the carrier frequency (baseband and harmonics) were neglected. The output of the PA in FIG. 5 is given in equation (4). To determine the parameters, $b_i$, equation (6) was expanded and minimized.

$$y(n) = \sum_{p=1}^{\frac{P-1}{2}} a_{2p+1} |x(n)|^{2p} x(n) \qquad (4)$$

$$\text{where } x(n) = \sum_{q=1}^{\frac{P-1}{2}} b_{2q+1} |u(n)|^{2q} u(n) \qquad (5)$$

$$e(n) = y(n) - u(n) \qquad (6)$$

Figure 6:
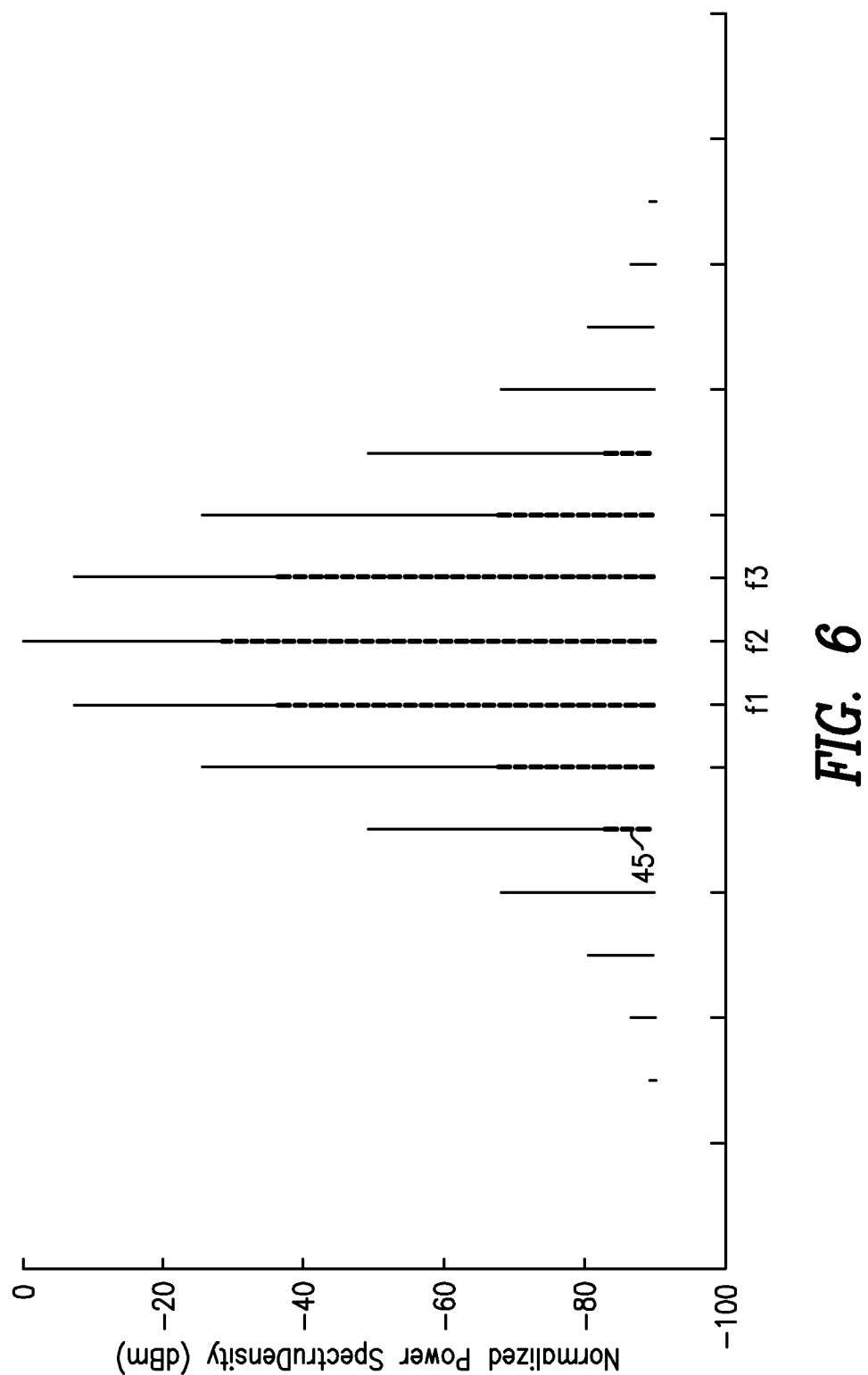
FIG. 6 is a spectrum of the output of a PA excited by a multi-tone signal with evenly spaced tones.
Figure 7:
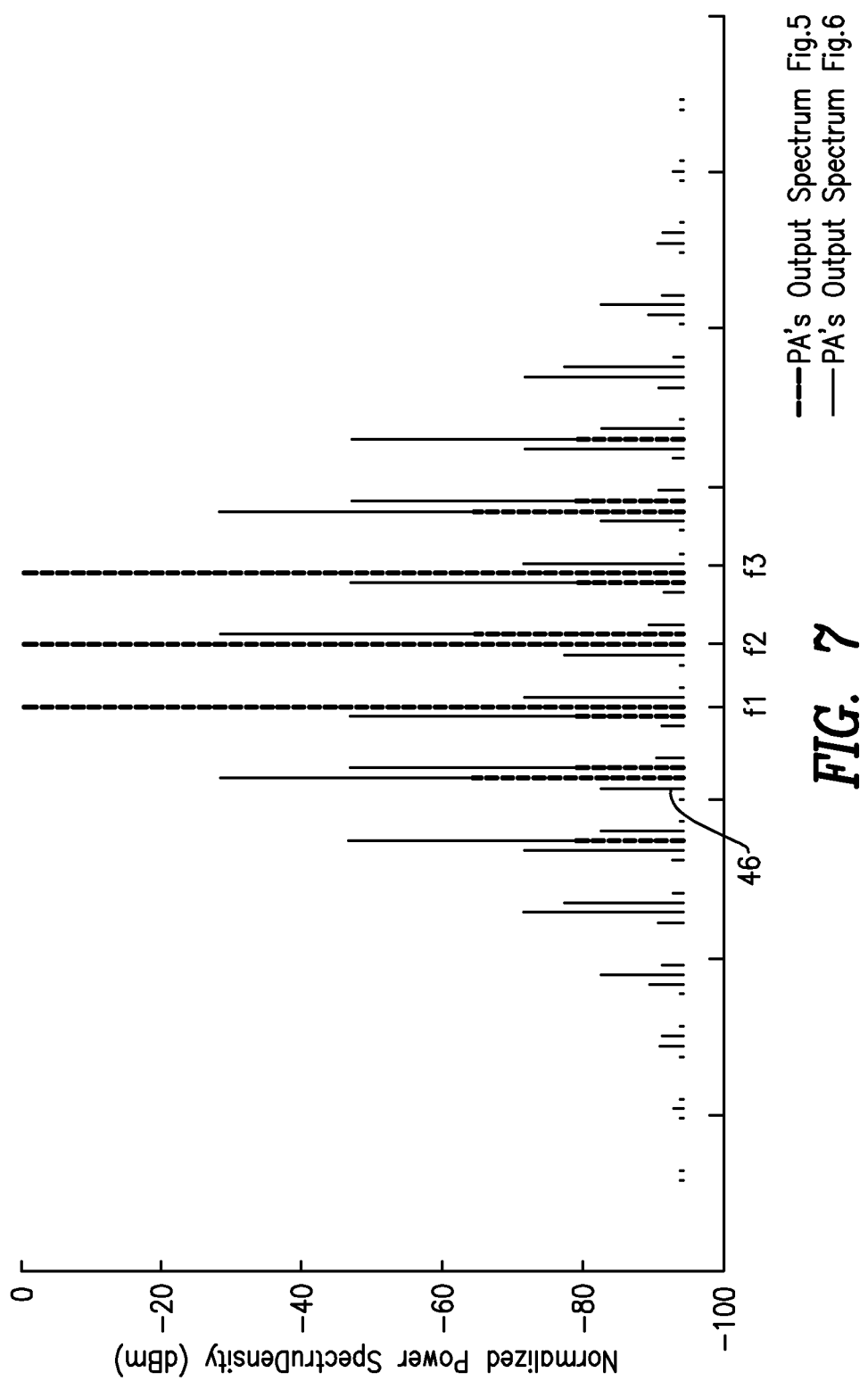
FIG. 7 is a spectrum of the output of a PA excited by a multi-tone signal with unevenly spaced tones.

FIGS. 6 and 7 show the input and output frequency components of the system in FIGS. 4 and 5. In FIG. 6, equal spaced tones were used, whereas in FIG. 7, non-uniform spaced tones were used. It can be observed that in FIG. 6, no visible in-band IMDs were generated at the output of the PA, even in the presence of DPD. The generated IMDs 45 were folded on top of the pre-existing tones. However, when the three tones are not spaced uniformly, FIG. 7 shows that the DPD nonlinear function generated many additional IMDs 46 inside the in-band and close to the in-band signal of the PA output. Therefore, many additional equations can be derived when using the in-band and close-to-in-band frequency components as compared to using only the PA without a DPD. Actually, when equation (6) is expanded, within a TOR path with a bandwidth equal to twice the bandwidth of the input signal, a total of 11 independent equations were found in the case of FIGS. 4 and 25 in the case of FIG. 5. One can conclude that a reduced TOR path is feasible for the identification of $b_i$ due to the presence of the nonlinear DPD function prior to the PA. Therefore, identifying a DPD model is possible using a reduced-bandwidth TOR path.

Note that while the TOR bandwidth may be reduced at the output of the PA, the input signal of the PA 28 should still be sampled at full rate (sampling equal to at least about 5×INR). In fact, the generation of the IMDs at the input of the PA 28 is what makes the sampling rate reduction possible in the TOR path. This allows the generation of IMDs inside the in-band and close to the in-band region. In other words, a reduced TOR bandwidth may only be possible when using a full speed DAC 39 (>5×INR) at the input of the PA 28. This is in contrast to the band-limited Volterra series where both the input and the output of the PA are sampled at the reduced rate of 2×INR. The reduced rate of the input signal in the band-limited Volterra series yields to linearization only within the observed band; very little linearization is obtained out of band. However, using a DPD with reduced TOR bandwidth together with full speed DAC, linearization is also possible outside of the observed band. This hypothesis is supported by simulation and measurement results as presented below.

Above, it was shown that within a bandwidth equal to that of the input signal, enough signal information at the output is present to model/linearize the PA output signal. However, due to potential modeling error in selecting the right kernels for the DPD 40 (selecting kernels that do not represent the inverse of the PA model), the sampling rate within the TOR 38 may be set to 2×INR instead of 1×INR to achieve acceptable linearization.

The DPD structure is thought to be appropriate when an optimal set of kernels is selected for the DPD to represent the inverse of the PA. Conversely, the wrong DPD structure means that either different or more or less kernels are selected to form the DPD model. As an example, if a PA model is given in equation (7), the right DPD model should be similar to equation (8). Thus, when selecting the kernels of equation (8) it may be that the correct DPD structure is selected. Whenever any other or fewer or more kernels are selected to form a DPD model, (e.g., like in equations (9) or (10)), it may be that the wrong DPD structure has been selected. Similarly, in the case of a PA with memory modelled according to equations (11) and (12) represents the correct DPD structure, whereas the model of equations (13) and (14) represent an incorrect DPD structure.

$$y(n)=a_1x(n)+a_3x^3(n) \quad (7)$$

$$x(n)=b_1u(n)+b_3u^3(n) \quad (8)$$

$$x(n)=b_1u(n)+b_5u^5(n) \quad (9)$$

$$x(n)=b_1u(n)+b_3u^3(n)+b_5u^5(n)+b_7u^7(n) \quad (10)$$

$$y(n)=a_1x(n)+a_3x(n-1)x(n-2)x(n) \quad (11)$$

$$x(n)=b_1u(n)+b_3u(n-1)u(n-2)u(n) \quad (12)$$

$$x(n)=b_1u(n)+b_5u(n)u(n-2)u(n) \quad (13)$$

$$x(n)=b_1u(n)+b_{3,1}u(n-1)u(n)u(n)+b_{3,2}u^3(n) \quad (14)$$

In the case where an exact DPD structure is selected, a sampling rate in the TOR 20 equal to 1×INR can be used for the linearization of the PA output, as explained before. Actually, since the exact DPD structure is selected, the coefficients identified using the in-band information should ensure the construction of the PA inverse model that covers the out-of-band region too. However, if an incorrect DPD structure is used, the coefficients identified using the in-band information will not guarantee good accuracy in the out-of-band region and an exact PA inverse model is not achieved. In such case, the constructed DPD may only fit the inverse of the PA within the in-band region and deviate outside the in-band region. In practice, it may be almost impossible to come up with the exact DPD kernels for at least the following reasons:

Complexity; since only a limited number of kernels may be allowed, there may be some kernels missing that perfectly describe the inverse of the PA (i.e., the correct DPD); and Modeling error due to measurement noise and calibration In a simulation environment (modelling error free mode) and using a memory-less model (reduced complexity mode), it may be shown that when an exact DPD model structure is found, a sampling rate equal to 1×INR in the TOR path suffices to linearize the output of the PA model. Consider the simple case of a memory-less PA as was given in equation (1) with P=7. The DPD structure is easy to find and is equal to a memory-less polynomial given in equation (2) with P=7. In this case, identification of $b_i$ can be done while sampling in the TOR at a speed equal to 1×INR and a linearization of the PA output is achieved. However, as noted, when the DPD structure is not known, a higher sampling rate in the TOR may be required.

Figure 8:
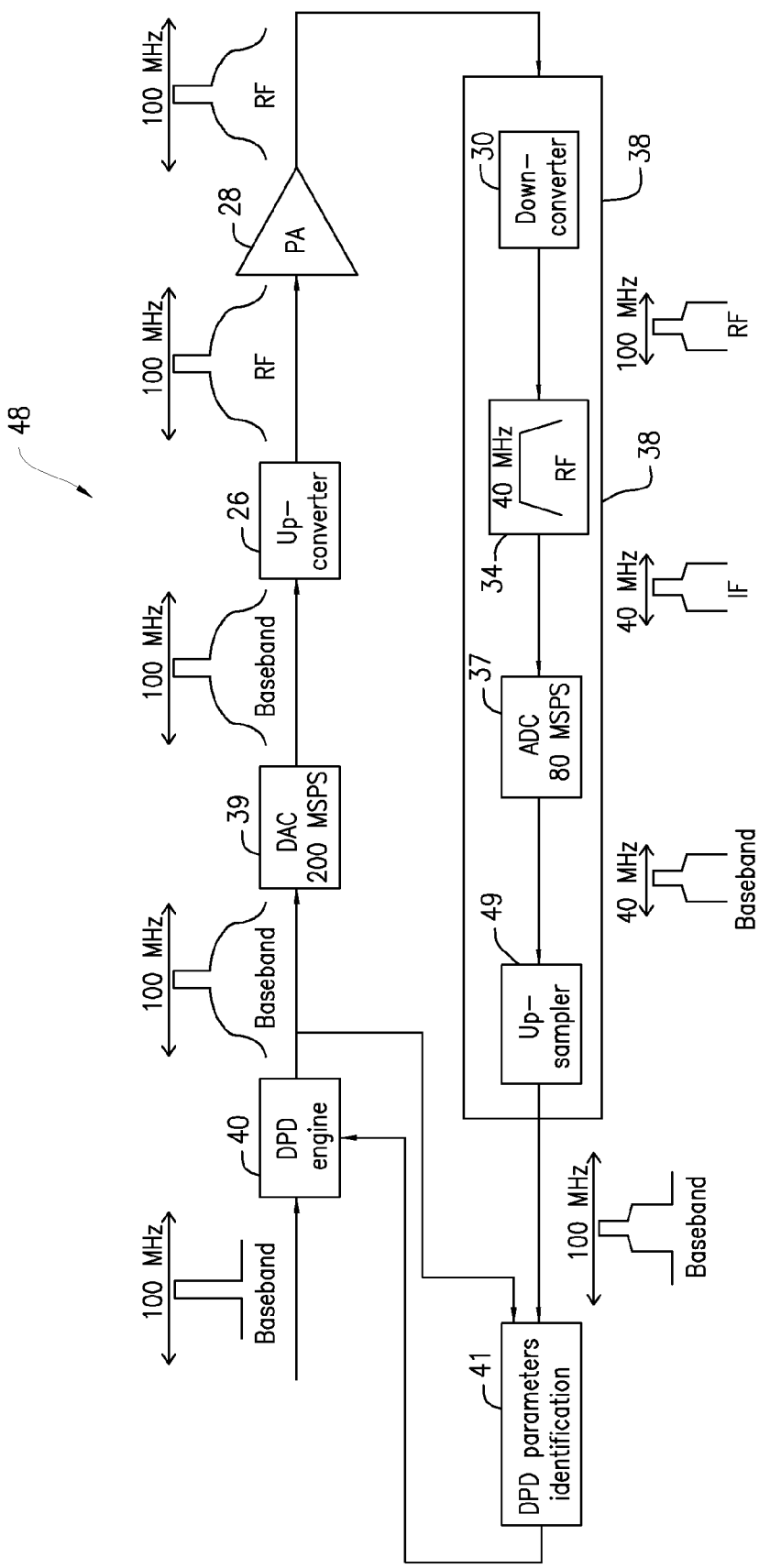
FIG. 8 is a block diagram of a DPD and PA cascade, showing a high sampling rate in the transmit path and a low observation bandwidth in the TOR path.

To demonstrate the efficacy of the inventive approach, FIG. 8 is a block diagram of a simulation structure 48 for a DPD 40 and PA 28 cascade using a reduced TOR 38 path. The example is provided for a 20 MHz bandwidth input signal. It is shown below that wider band signals may also be input into the structure 48, and still achieve linearization in and out of band. In the example of FIG. 8, the DPD engine 40, being full rate, generates a 100 MHz predistorted signal from a 5 times oversampled input signal. A 200 MHz DAC 39 converts the digital signal to analog and an up-converter 26 brings the analog signal to RF. The PA 28 initially produces an output signal having a bandwidth equal to at least 100 MHz. Since the simulation structure 48 of FIG. 8 demonstrates the use of a reduced TOR bandwidth, the PA output signal goes through a bandpass filter 34 with a bandwidth equal to 40 MHz. This allows the capture of the output signal without aliasing.

Indeed, although the output signal has an initial bandwidth of at least about 100 MHz, the analog-to-digital converter (ADC) 37 speed is 80 Mega samples per second (Msps) allowing a capture of only 40 MHz. To avoid aliasing, the signal is first down-converted by a down-converter 30, filtered by the anti-aliasing band pass filter 34 and then sent to the ADC 37 which converts the filtered signal into digital form. Up-sampling of the digitized output signal by the up-sampler 49 is carried out to ensure the matching between the rates of the samples representing the PA input and output signals (2×100 Msps). This does not recover the filtered spectrum but rather augments the sampling rate of the output signal to match the full rate of the DPD engine 16. The output of the DPD engine 40 and the TOR 38 are then used to identify the DPD parameters via DPD parameters identifier 41. Finally, the coefficients of the DPD engine 40 are updated and another iteration of the previous steps is begun. With enough iterations, the output of the power amplifier 28 should approximate an amplified version of the input spectrum without substantial distortion.

Figure 9:
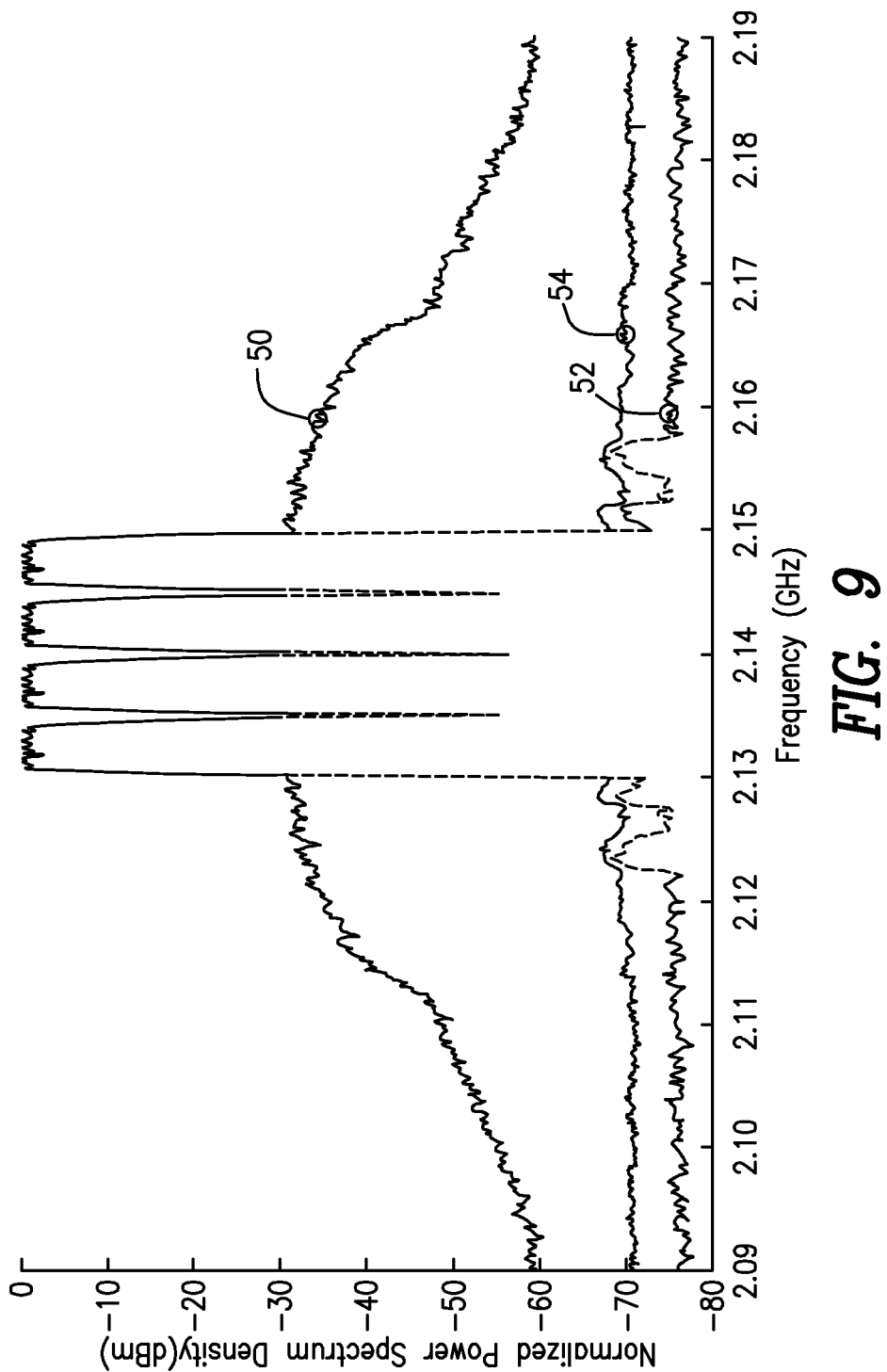
FIG. 9 shows spectra of a PA output without DPD and with DPD when the optimum model of a DPD is achieved and the envelope of the power amplifier output signal is sampled a rate that is about equal to the Nyquist rate of the modulated input signal.

FIG. 9 shows the output of a nonlinear PA without DPD, curve 50, and with DPD, curves 52 and 54, where the input signal is 4-code wideband code division multiple access (WCDMA) having a bandwidth of 20 MHz. For the curve 52, the DPD was constructed using the conventional approach that uses a sampling rate in the TOR equal to 5×INR. Curve 54 is the result when a reduced sampling rate in the TOR equal to 1×INR and a high sample rate in the transmit path is used in accordance with the approach described herein. It is clear from FIG. 9 that both DPD approaches were able to linearize the output signal of the PA 28. It can be concluded then that when the structure of the DPD is known a priori, sampling the output signal at 1×INR is sufficient.

Figure 10:
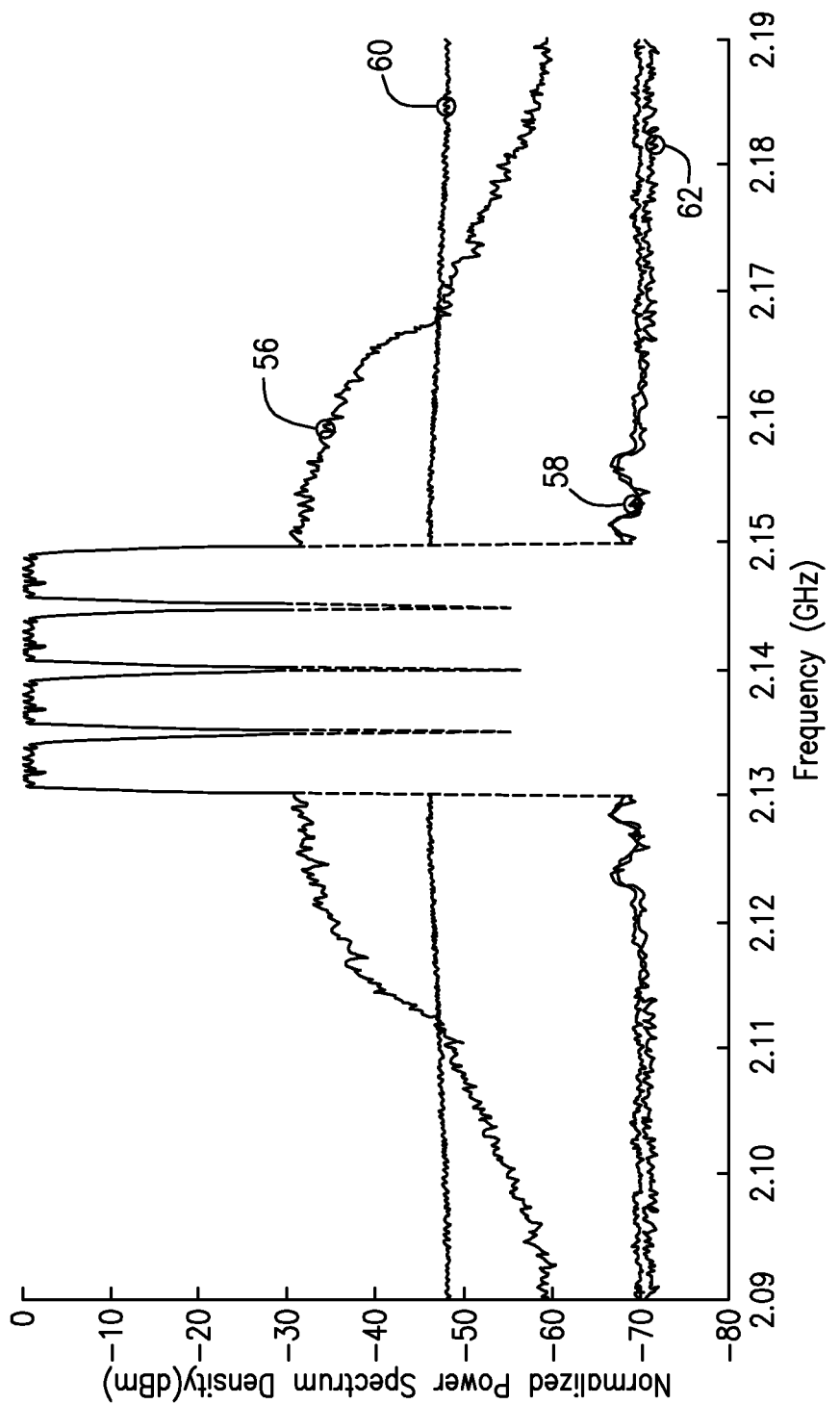
FIG. 10 shows spectra of a PA output without DPD and with DPD when an optimum model of a DPD is not achieved and the envelope of the power amplifier output signal is sampled at a rate that is about equal to the Nyquist rate of the modulated input signal.

When the DPD structure is not chosen correctly (i.e. in the cases of over/under modeling or incorrect choice of the set of kernels) and the sampling rate in the TOR is set to 1×INR, it is anticipated that the linearization capability will be limited. If the sampling rate of the TOR is increased to 2×INR, even if the right DPD kernels have not been selected, good linearization will be achieved. FIG. 10 shows the linearization capabilities of a memory-less DPD model when N=13 (over modeling). In FIG. 10, curve 56 is the power amplifier output without DPD. It is clear from FIG. 10 that when the sampling rate at the output of the PA, i.e., in the ADC of the TOR, was set to 5×INR, as in curve 58, a good reduction of the output spectrum was observed. However, when the sampling rate in the ADC of the TOR was reduced to 1×INR, as in curve 60, the linearization capabilities degrade as there were uncorrelated IMDs inside and outside the in-band region. In this case, the over modeling curve only fit the inside IMDs. Since more degrees of freedom than needed are present in the model, there is no guarantee that the out of band IMDs will be deduced. Consequently, limited linearization was recorded. However, when the sampling rate of the ADC in the TOR was increased to 2×INR, as for curve 62, some of the outside IMDs were captured and accurate linearization/modeling was achieved inside and outside the observation path as shown.

Figure 11:
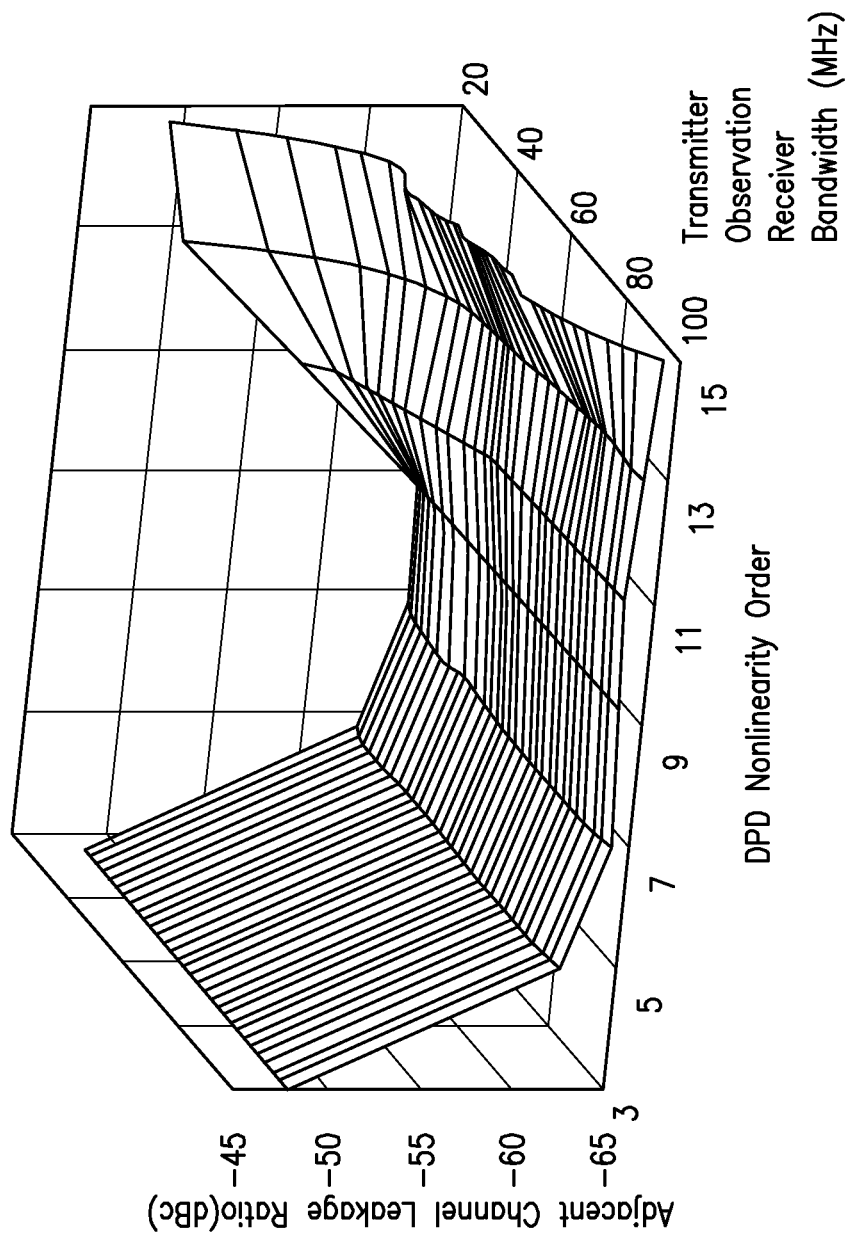
FIG. 11 is a plot of adjacent channel leakage ratio (ACLR) performances for a memory-less model against the TOR bandwidth and nonlinearity order of a DPD.

FIG. 11 shows the adjacent channel leakage ratio (ACLR) performances for the memory-less model against the TOR bandwidth (sampling rate) and nonlinearity order of the DPD. As can be seen, for a given TOR bandwidth, ACLR increases when the DPD nonlinearity order becomes too small or too large. When the DPD structure is known a priori, and the nonlinearity order is moderate, e.g., P~=7, a reduction of the sampling rate to 1×INR, corresponding to a TOR bandwidth of 20, is possible without trading-off the linearization capabilities. However, as soon as the nonlinearity order begins to drift from P=7, the linearization capabilities are degraded if the sampling rate is decreased to less than 2×INR. Note that, for cases where P<7, the performances are limited even for high sampling rates due to under modeling.

FIG. 11 demonstrates that if the DPD structure is known, a sampling rate of the ADC of the TOR equal to about 1×INR can be deployed without trading-off the linearization capabilities. However, when the DPD structure is not precisely known, the sampling rate should be increased to at least about 2×INR in order to achieve good linearization. For realistic PAs, memory effects (MEs) are introduced in addition to the static nonlinearity and therefore an exact DPD model structure is more challenging and complex to determine. There is no guarantee that the correct DPD kernels can be identified, especially when the PA is driven with wideband signals (exhibiting stronger MEs). For this reason, in the embodiments of the invention described herein, the reduced sampling rate in the TOR is set to at least about 2×INR while maintaining a high sampling rate in the transmit path to improve the linearization capabilities. This is still a considerable reduction of the ADC speed requirement as a ⅖ reduction rate is achieved compared with the conventional approach.

As noted above, the DPD parameters are derived based on a Volterra series that is pruned with G-functionals. The Volterra series is a general framework for modeling nonlinear dynamic systems and has been applied successfully to PA behavioral modeling and digital pre-distortion. The Volterra series formulation is convergent for fading memory systems. However, the number of parameters needed for a practical PA's degree of nonlinearity and memory depth is still large. Selecting the right kernels for the DPD aids in reducing the sampling rate of the TOR. The G-functional pruned Volterra series may be used for a better approximation of the correct DPD structure. This pruning technique is described as follows.

Consider a dynamic nonlinear system, a PA for instance, described by the Volterra series model given in equation (15), where x(n) and y(n) are respectively the input and the output signal of the system, and $h_n$ represents the Volterra series kernels.

$$y(n) = \sum_{p=0}^{\infty} H_p[x(n)] \quad (15)$$

$$= \sum_{n=0}^{\infty} \sum_{m_1=0}^{\infty} \cdots \sum_{m_n=0}^{\infty} h_n(m_1, \ldots, m_n) x(n - m_1) \ldots x(n - m_n)$$

Application of Wiener G-functionals reformulates the Volterra series equations into an equivalent set of equations where an orthogonal property can be exploited. This reformulation builds on the orthogonality in the Gaussian noise to determine a simplified expression of the Volterra series kernels. In this case, white Gaussian noise can be first used to identify an optimal set of kernels that represent the best fit DPD function. Then, a modulated signal and only the selected kernels are used to identify a pruned Volterra DPD model.

The pruned Volterra model is used to validate the reduced TOR bandwidth/high transmit path sampling rate approach in simulation using multi-tone and modulated signals. First, three-, four- and five-tones signals were used as input signals to the memory-less nonlinear PA model given in equation (3). The sampling rate of the output of the PA was set to 2×INR instead of the usual 5×INR. In other words, if the input signal bandwidth was set to 20 MHz, the required ADC sampling rate would be only 80 Mega-samples-per-second (Msps) (40 MHz bandwidth observation) instead of 200 Msps (100 MHz bandwidth observation). The output signal was then up-sampled by a factor of 5/2 to match the bandwidth of the input of the PA (the pre-distorted signal) and the DPD coefficients were identified. Ten iterations of this process were performed. After enough iterations, the DPD aligned with the inverse of the PA behavior. This approach can be summarized by the following algorithm:

---

Initialize $g_0(u(n))$ to a random nonlinear expansion function;
    pre-defined G-Functional can be used
    i.e. set initial values for the DPD coefficients
    $B = [h_1^0(\sigma_1) \ldots h_P^0(\sigma_1, \ldots, \sigma_P)]^T$;
for k from 1 to 10 do
| compute $x_k(n) = g_{k-1}(u(n))$
|    convert discrete $x_k(n)$ to continuous $x_k(t)|F_s = 5 \cdot INR$
|    upconvert $x_k(t)$ to RF
|    downconvert the PA output $y_k(t)$ to IF
|    sample continuous $y_k(t)$ to discrete $y_k(n')|F_s = 2 \cdot INR$
|    up-sample $y_k(n')$ by 5/2 to produce $y_k(n)$
|    Identify DPD parameters with least squuare error (LSE)
|    $B = (Y^T Y)^{-1} Y^T X = [h_1^i(\sigma_1) \ldots h_P^i(\sigma_1, \ldots, \sigma_P)]^T$
|    where $X = [x_k(n) \ldots x_k(n - M)]^T$ $$Y = \begin{bmatrix} y_k(n - \sigma_1) & \cdots & y_k(n - \sigma_1) & \cdots & y_k(n - \sigma_{n_P}) \\ \vdots & \ddots & & & \vdots \\ y_k(n - M - \sigma_1) & \cdots & y_k(n - M - \sigma_1) & \cdots & y_k(n - M - \sigma_{n_P}) \end{bmatrix}$$

end

Figure 12:
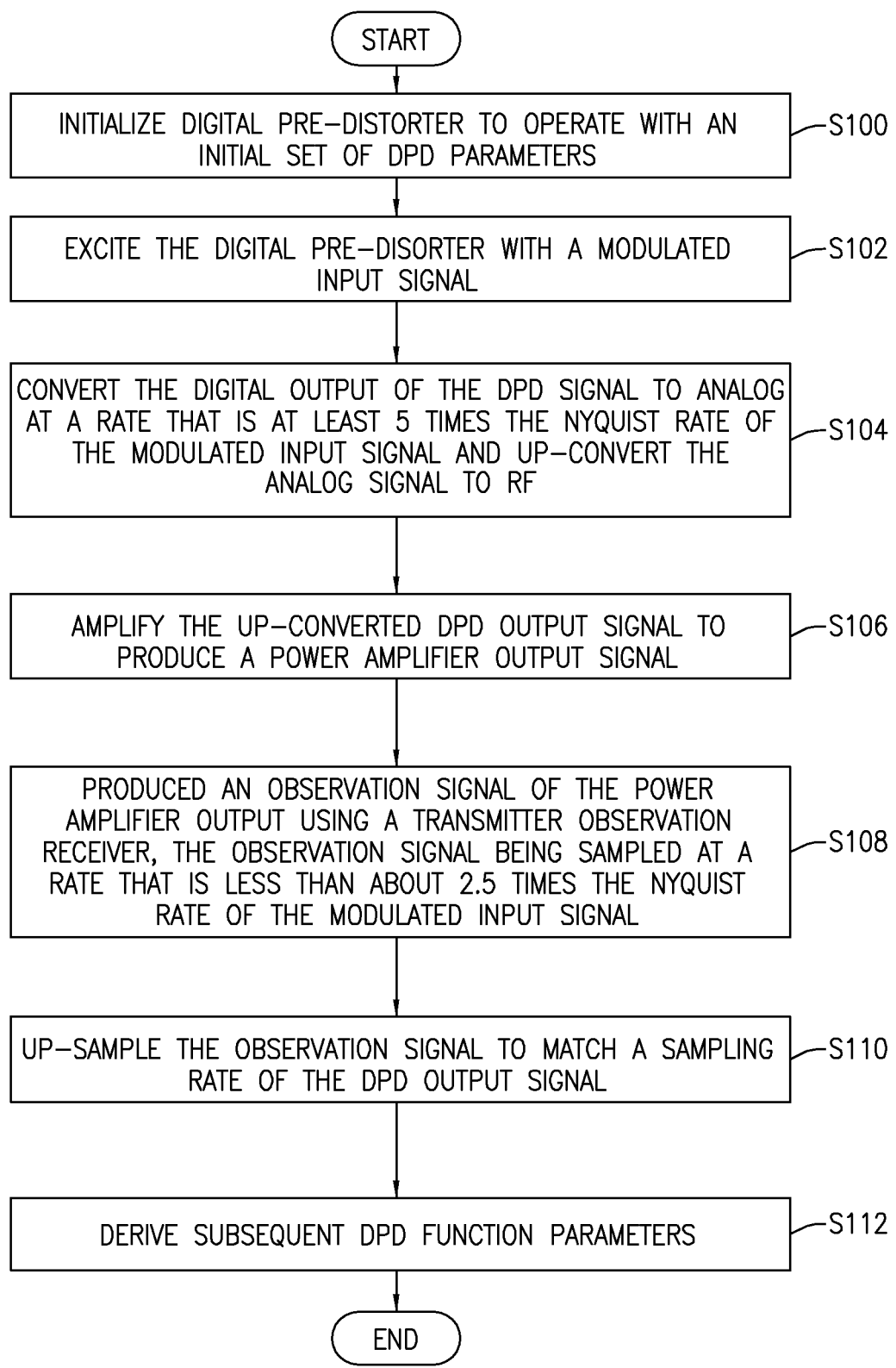
FIG. 12 is a flowchart of an exemplary process of digital pre-distortion (DPD) function parameters for pre-distortion of input signals of a power amplifier having a non-linear behavior, according to principles of the present invention.

FIG. 12 is a flowchart of an exemplary process of digital pre-distortion (DPD) function parameters for pre-distortion of input signals of a power amplifier having a non-linear behavior. A digital pre-distorter (DPD) 40 is initialized to operate with an initial set of DPD function parameters from a parameter identifier 41 (block S100). This may be accomplished by using a Volterra series that is pruned with G-functionals, as described above. The DPD 40 is excited with a modulated input signal having a bandwidth to produce a DPD output signal having distortion lying within and outside a frequency range defined by the bandwidth of the modulated input signal (block S102). The DPD output is converted to an analog signal via the DAC 39 having a sample rate that is at least about 5 times a Nyquist rate of the modulated input signal, and up-converted via the up-converter 26 to RF (block S104). The up-converted analog signal is amplified via the power amplifier 28 to produce a power amplifier output signal (block S106).

When the DPD is not yet optimal because, for example, too few iterations have been performed, the power amplifier output signal will have distortions lying inside and outside the frequency range defined by the bandwidth of the modulated input signal. An observation signal is produced in a transmitter observation receiver (TOR) 38 (block S108). The observation signal has at least a portion of the bandwidth of the power amplifier output signal and is sampled at a rate that is about 2 times the Nyquist rate of the modulated input signal via the ADC 37. The observation signal is up-sampled via the up-sampler 49 to match a sampling rate of the DPD output signal (block S110).

Subsequent DPD function parameters are generated via the DPD parameters determiner 41 based on the up-sampled observation signal and the DPD output signal (block S112). The process of FIG. 12 may be repeated until a determination is made that the DPD is optimized. This determination may be made when a difference between a response of the DPD and an inverse of a nonlinear response of the power amplifier is less than a specified amount, or when, for example, substantial linearity is achieved over a frequency band that is at least five times the bandwidth of the modulated input signal.

Figure 13:
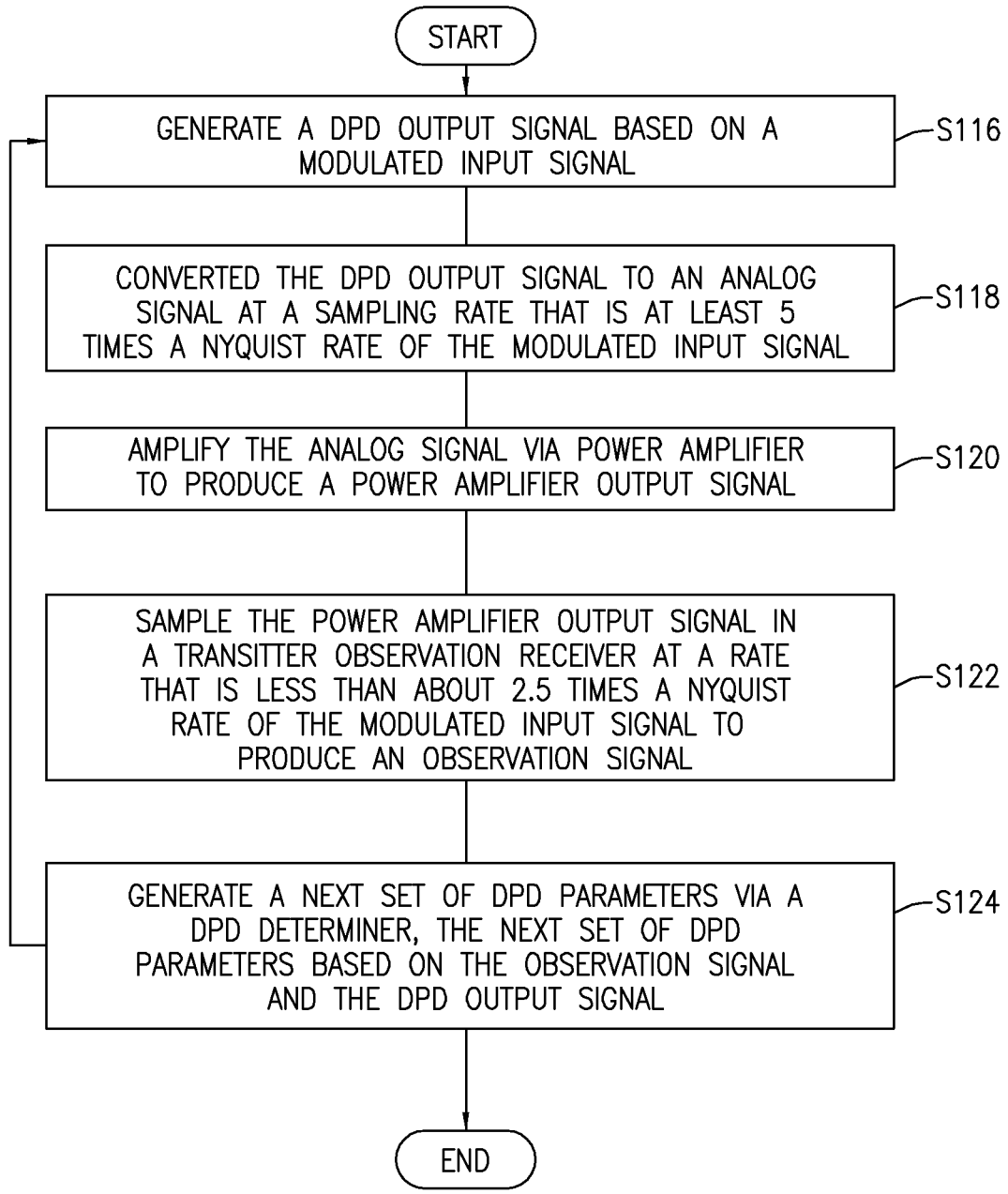
FIG. 13 is a flowchart of an exemplary process of generating DPD parameters of a DPD comprising iteratively updating the DPD parameters, according to principles of the present invention.

FIG. 13 is a flowchart of an exemplary process of generating DPD parameters of a DPD 40 in which the DPD parameters are iteratively updated. A DPD output signal is generated based on a modulated input signal using a set of parameters (block S116). The DPD output signal is converted to an analog signal at a sampling rate that is at least about 5 times a Nyquist rate of the modulated input signal (block S118). The DPD output signal is amplified to produce a power amplifier output signal (block S120). In early iterations of the process, the power amplifier output signal may have an extended spectrum. The power amplifier output signal is sampled in a transmitter observation receiver (TOR) at a rate that is about 2 times the Nyquist rate of the modulated input signal to produce an observation signal that may include distortion introduced by the power amplifier (block S122). A next set of DPD parameters are generated by a DPD parameter identifier (block S124). The next set of DPD parameters are derived based on the observation signal and the DPD output signal. The process then returns to block S116, where the next set of DPD parameters are used to generate a DPD output signal. The process of FIG. 13 may be repeated until a difference between a response of the DPD and an inverse of a nonlinear response of the power amplifier is less than a specified amount, or when, for example, substantial linearity is achieved over a frequency band that is at least five times the bandwidth of the modulated input signal.

Figure 14:
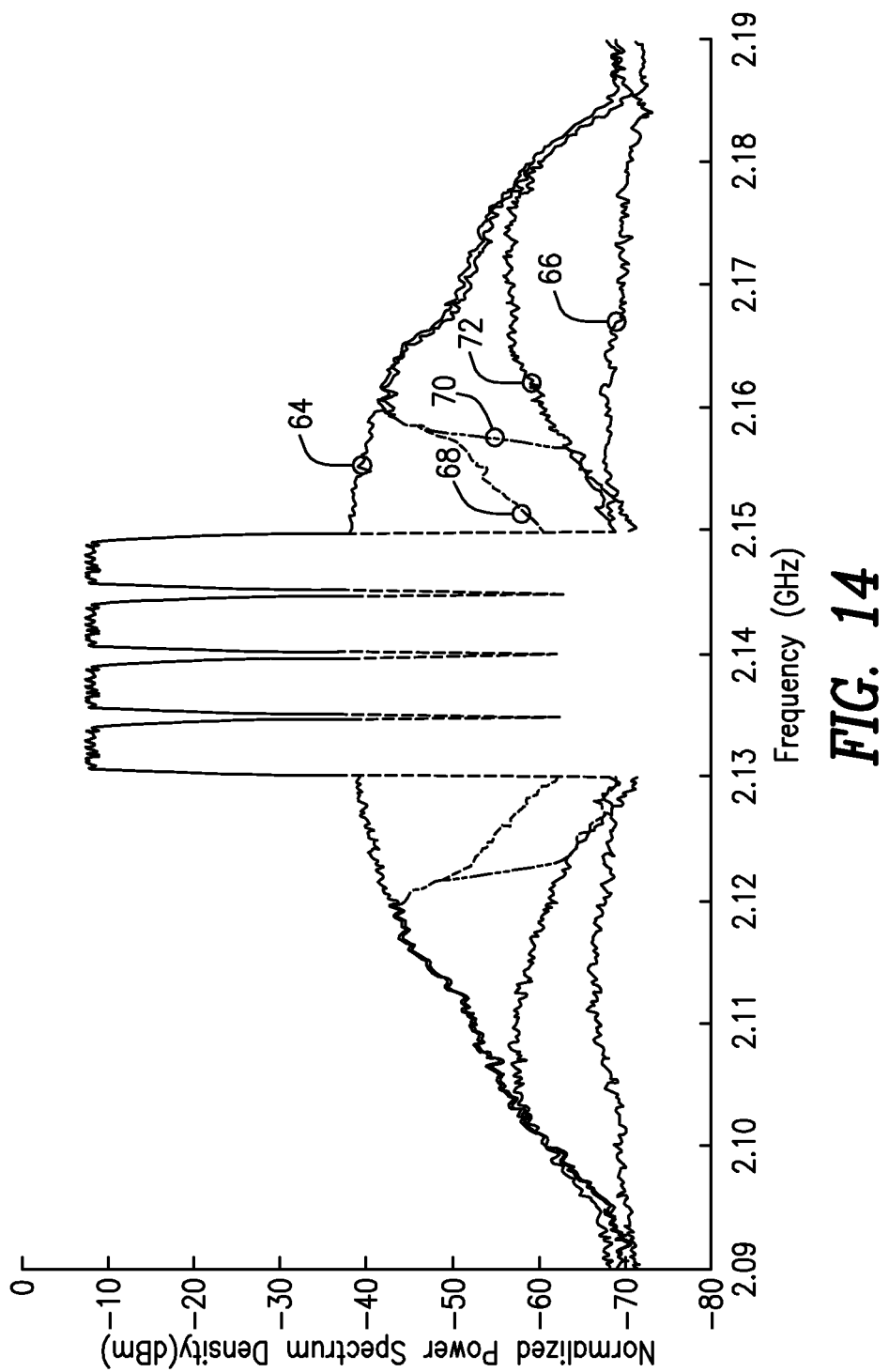
FIG. 14 is the simulated output spectra of a power amplifier in response to a 20 MHz 4C WCDMA signal without DPD, and with different DPD schemes.

FIG. 14 is the simulated output spectra of the PA 28 in response to a 20 MHz 4C WCDMA signal without DPD, curve 64, and with different DPD schemes summarized in Table I.

TABLE I

Different Linearization Digital Predistortion Schemes

| | DAC Speed | ADC Speed | DPD Speed |
|---|---|---|---|
| Conventional DPD with Full Bandwidth | 5 × INR | 5 × INR | 5 × INR |
| Conventional DPD with Limited Bandwidth | 2 × INR | 2 × INR | 2 × INR |
| Band-Limited Volterra series DPD | 2 × INR | 2 × INR | 5 × INR |
| DPD with RTB/HTPSR | 5 × INR | 2 × INR | 5 × INR |

Curve 66 is the PA output for a conventional DPD with full bandwidth (row 1 of Table 1). Curve 68 is the PA output for a conventional DPD with limited bandwidth (row 2 of Table 1). Curve 70 is the PA output for a band-limited Volterra DPD (row 3 of Table 1). Curve 72 is the PA output for a DPD with reduced TOR bandwidth (RTB) with high transmit path sampling rate (HTPSR) (row 4 of Table 1.) The DPD parameters are identified with a time step T=1/(5×INR), except for the case of conventional band-limited DPD which uses a time step of T=1/(2×INR)

The DPD for all four cases of Table 1 were iterated 10 times for convergence. On the one hand, after 10 iterations, the RTB/HTPSR approach, wherein the TOR samples the power amplifier output at 80 Mega-samples per second (Msps), while the sampling rate in the transmit path is 200 Msps, allowed an adjacent channel power ratio (ACPR) of less than −50 dBc. On the other hand, the DPD with the PA output signal sampled at 200 Mega-samples per second had faster convergence and allowed an ACPR reduction of about −60 dBc. Note that only the DPD with RTB/HTPSR has the combination of high rate DAC 39 and low rate TOR ADC 37 sampling.

Note also that the band-limited Volterra series, having a low rate of sampling in both the transmit path and the TOR path, was able to linearize the PA only within the observed band; no linearization was achieved elsewhere, as in curve 70. Finally, the band-limited conventional DPD shows no linearization outside the observed band and poor linearization within, as in curve 68. Thus, it can be concluded that under simulation, the reduced TOR bandwidth with high transmit path sampling rate succeeded in linearizing the PA output signal within and outside the observation path but achieved slightly less ACPR reduction than other methods, as in curve 72. Nevertheless, the sampling rate was lowered by more than half, thereby trading-off some ACPR reduction while still passing the WCDMA mask.

Figure 15:
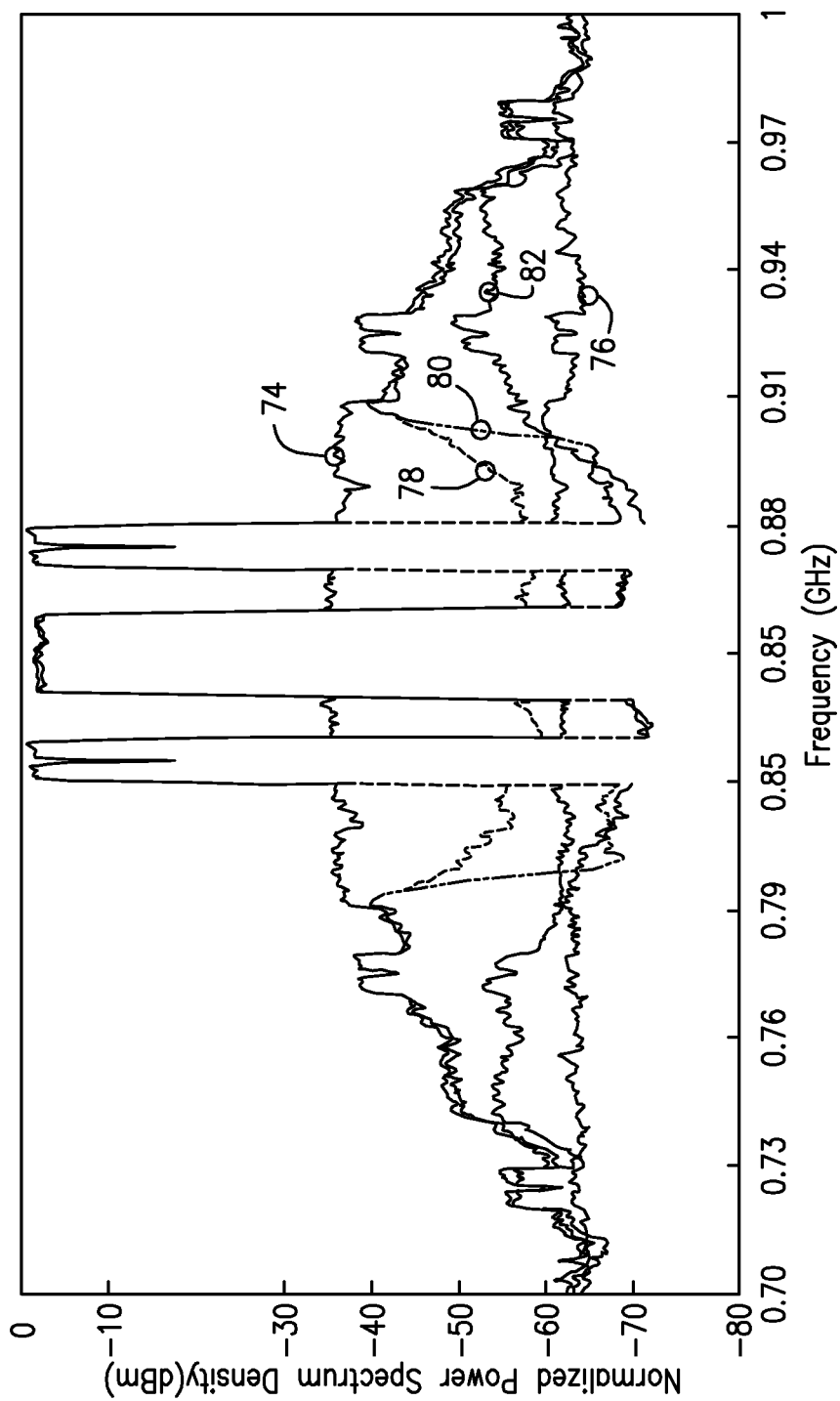
FIG. 15 is the simulated output spectra of a PA in response to a 60 MHz mixed long term evolution (LTE) signal without DPD, and with the different DPD schemes.

FIG. 15 is the simulated output spectra of a PA in response to a 60 MHz mixed long term evolution (LTE) signal without DPD, curve 74, and with the different DPD schemes of Table 1. Curve 76 is the PA output for a conventional DPD with full bandwidth (row 1 of Table 1). Curve 78 is the PA output for a conventional DPD with limited bandwidth (row 2 of Table 1). Curve 80 is the PA output for a band-limited Volterra DPD (row 3 of Table 1). Curve 82 is the PA output for a DPD with reduced TOR bandwidth with high transmit path sampling rate (RTB/HTPSR) (row 4 of Table 1.)

The same conclusions were found in the case where the input signal bandwidth was 60 MHz as shown in FIG. 14, as compared to FIG. 15. The conventional DPD with full bandwidth and the DPD with reduced TOR bandwidth were able to linearize the PA for more than −50 dBc, meeting the spectrum mask. Similarly, the band-limited Volterra series could only linearize inside the observed band. The conventional DPD with limited bandwidth achieved poor linearization performance even within the observed band. Note that the DPD with reduced TOR bandwidth and with high transmit path sample rate consumed more iterations than the conventional DPD to achieve comparable results. Therefore, one can conclude that using the DPD with reduced TOR bandwidth and high rate transmit path sampling, linearization of a given PA is possible inside and outside the observed band without a severe degrading of the linearization performance.

Note that the DPD with RTB/HTPSR and the band-limited Volterra series model achieved better ACPR near to the in-band signal. When sampling at large time step (small bandwidth), both the receiver noise figure and flatness are better than when using small time step (large bandwidth). Therefore, the characterization of the output signal close to the in-band region was better in the case of the proposed model with RTB/HTPSR and band-limited Volterra series DPDs. Consequently, better linearization was recorded in that region.

Figure 16:
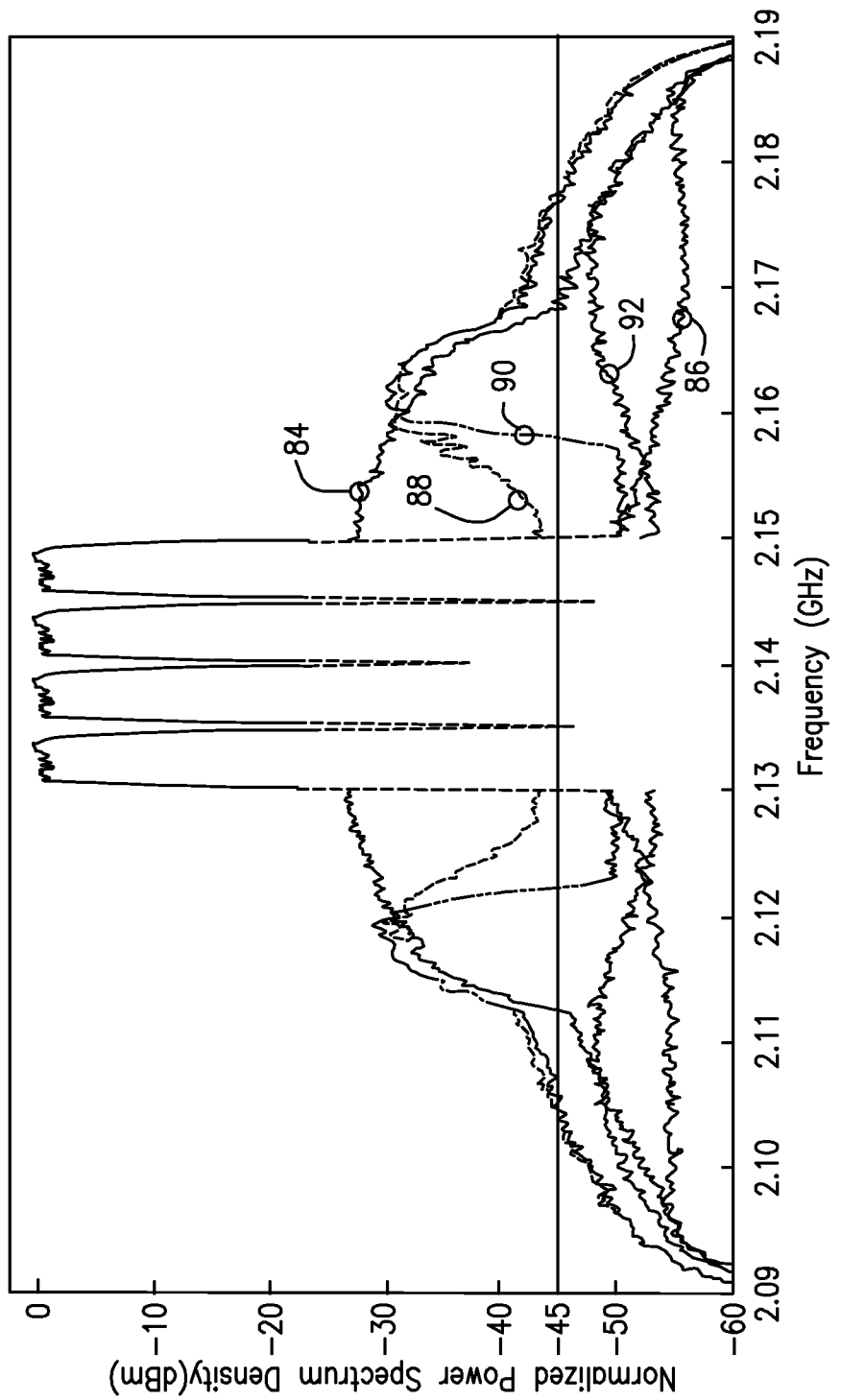
FIG. 16 is a plot of the output spectra of a GaN single end power amplifier driven with a 20 MHz 4C WCDMA signal without DPD and with a plurality of DPD schemes with a TOR sampling rate of 2 times the Nyquist rate of the modulated input signal (2×INR)

FIG. 16 is a plot of the output spectra of a GaN single end power amplifier driven with a 20 MHz 4C WCDMA signal under the different schemes set forth in Table 1. Curve 84 is the output without DPD. Curve 86 is the PA output for a conventional DPD with full bandwidth (row 1 of Table 1). Curve 88 is the PA output for a conventional DPD with limited bandwidth (row 2 of Table 1). Curve 90 is the PA output for a band-limited Volterra DPD (row 3 of Table 1). Curve 92 is the PA output for a DPD with reduced TOR bandwidth with high transmit path sampling rate (row 4 of Table 1.)

Figure 17:
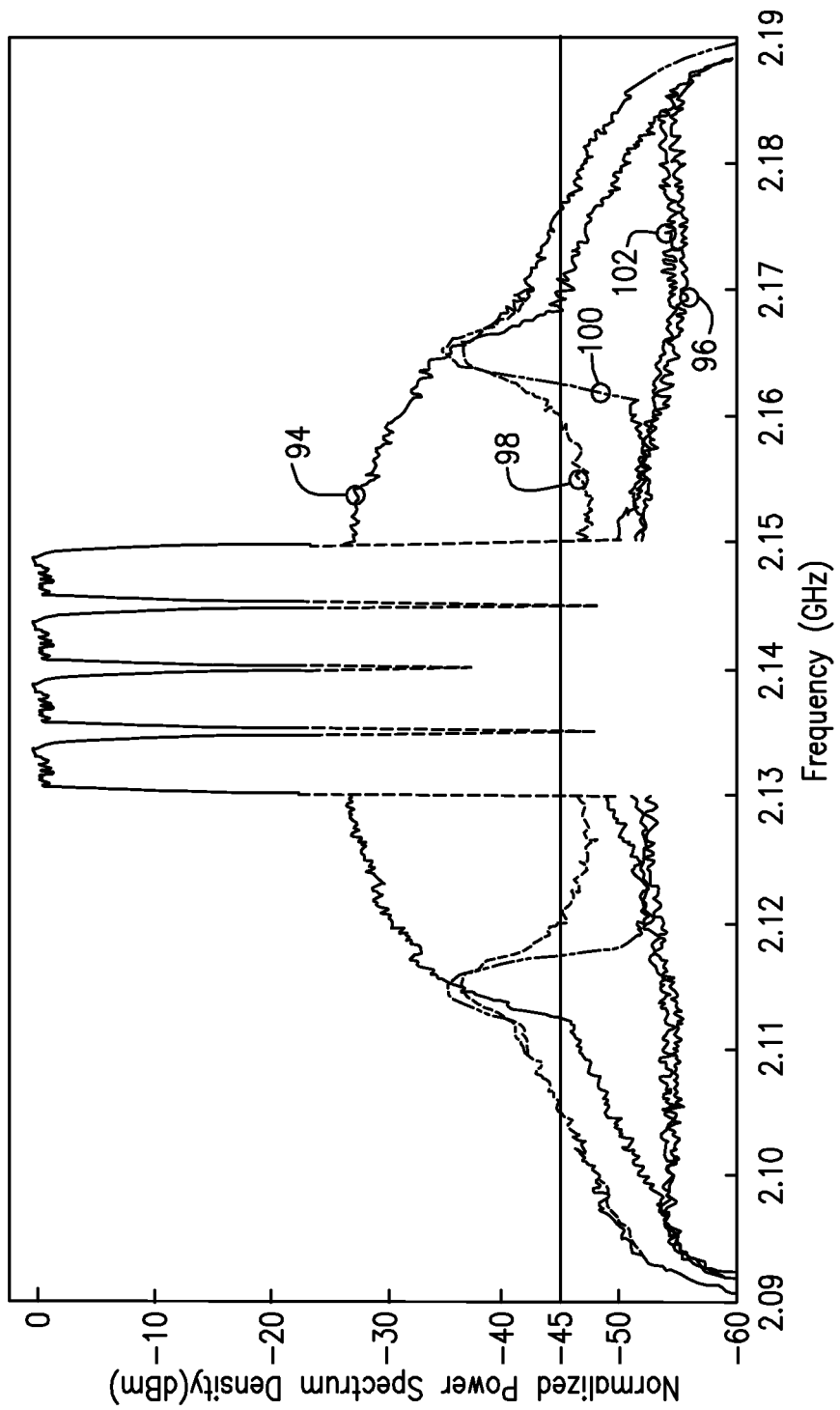
FIG. 17 is a plot of the output spectra of the GaN single end power amplifier driven with a 20 MHz 4C WCDMA without DPD and with the same schemes shown in FIG. 13 with the exception that the TOR sampling rate is 2.5×INR.

FIG. 17 is a plot of the output spectra of the GaN single end power amplifier driven with a 20 MHz 4C WCDMA without DPD (curve 94) and with the same schemes as discussed above with the exception that the TOR ADC sampling rate is 2.5×INR (as opposed to 2×INR) for the conventional DPD with limited bandwidth, the band-limited Volterra series DPD, and the DPD with reduced TOR bandwidth with high transmit path sampling rate. Curve 96 is the PA output for a conventional DPD with full bandwidth. Curve 98 is the PA output for a conventional DPD with limited bandwidth (2.5× INR). Curve 100 is the PA output for a band-limited Volterra DPD (2×INR). Curve 102 is the PA output for a DPD with reduced TOR bandwidth (2.5×INR) and high transmit path sampling rate (5×INR). Note that only the conventional DPD with full bandwidth and the DPD with RTB/HTPSR give substantial reduction of spectral regrowth throughout a wide out-of-band frequency region extending to more than twice the bandwidth of the modulated input signal.

Table II shows the measured adjacent channel leakage ratio (ACLR) for the configuration responses plotted in FIGS. 16 and 17.

TABLE II

Measured Adjacent Channel Leakage Ratio at the Output of the GaN single ended PA driven with 20 MHz 4C WCDMA Signal

| Model Type | | Offset | |
|---|---|---|---|
| | | 15 MHz | 25 MHz |
| Without DPD | | −20.92 | −28.15 |
| Conv DPD with Full Bandwidth | (5.0 × INR) | −51.70 | −54.46 |
| Conv DPD with Limited Bandwidth | (2.0 × INR) | −39.23 | −33.70 |
| Conv DPD with Limited Bandwidth | (2.5 × INR) | −47.53 | −36.92 |
| Band-Limited Volterra series DPD | (2.0 × INR) | −49.85 | −33.70 |

TABLE II-continued

Measured Adjacent Channel Leakage Ratio at the Output of the GaN single ended PA driven with 20 MHz 4C WCDMA Signal

| Model Type | | Offset | |
|---|---|---|---|
| | | 15 MHz | 25 MHz |
| Band-Limited Volterra series DPD | (2.5 × INR) | −52.62 | −35.54 |
| DPD with RTB/HTPSR | (2.0 × INR) | −52.62 | −49.38 |
| DPD with RTB/HRPSR | (2.5 × INR) | −52.62 | −54.92 |

As can be seen, less than about −50 dBc of ACLR, for in-band and out-of-band across 100 MHz bandwidth, was achieved using the conventional full bandwidth DPD or the DPD with RTB/HTPSR. However, it is clear from FIGS. 16 and 17 and Table II that when using the conventional DPD with a limited sampling rate (2-2.5 INR), the linearization performance dropped dramatically in the out-of-band region. Also, as before, the band-limited Volterra series exhibited substantial spectral regrowth (above 45 dBm) out of band, whereas there is no substantial spectral regrowth out of band for the reduced TOR bandwidth with high transmit path sampling rate method described herein.

The band-limited Volterra DPD almost matched the performance of the conventional DPD with full bandwidth inside the observed band, but did not improve the signal quality outside of the observed band. The DPD with RTB/HTPSR, however, showed linearization performances close to those of the conventional DPD with full bandwidth, even in the out-of-band region. In fact, about −50 dBc ACLR was maintained within and outside the observed bandwidth, as shown in FIGS. 16 and 17 and Table II. This shows the applicability of the DPD with reduced TOR bandwidth and high transmit path sampling rate for linearizing the PA output signal, even outside of the observed band, when enough iterations are allowed (for example, after 20 iterations for this specific example).

Thus, to improve the linearization capabilities of the DPD with reduced TOR bandwidth even further, the sampling rate of the ADC 64 was increased to 2.5×INR in FIG. 17. The conventional DPD with limited-bandwidth failed to linearize the PA output outside the observed band and only achieved limited linearization inside the observed band. The band-limited Volterra series DPD reduced the spectrum regrowth only within the observation bandwidth and did not improve the signal quality outside of the observed band. However, the linearization capabilities of the DPD with RTB/HTPSR were even closer to those of the DPD with full bandwidth, as shown in Table II. About −53 dBc ACLR was maintained across 100 MHz at the output of the PA even though only 50 MHz of output signal was captured and used during the DPD parameters identification.

Figure 18:
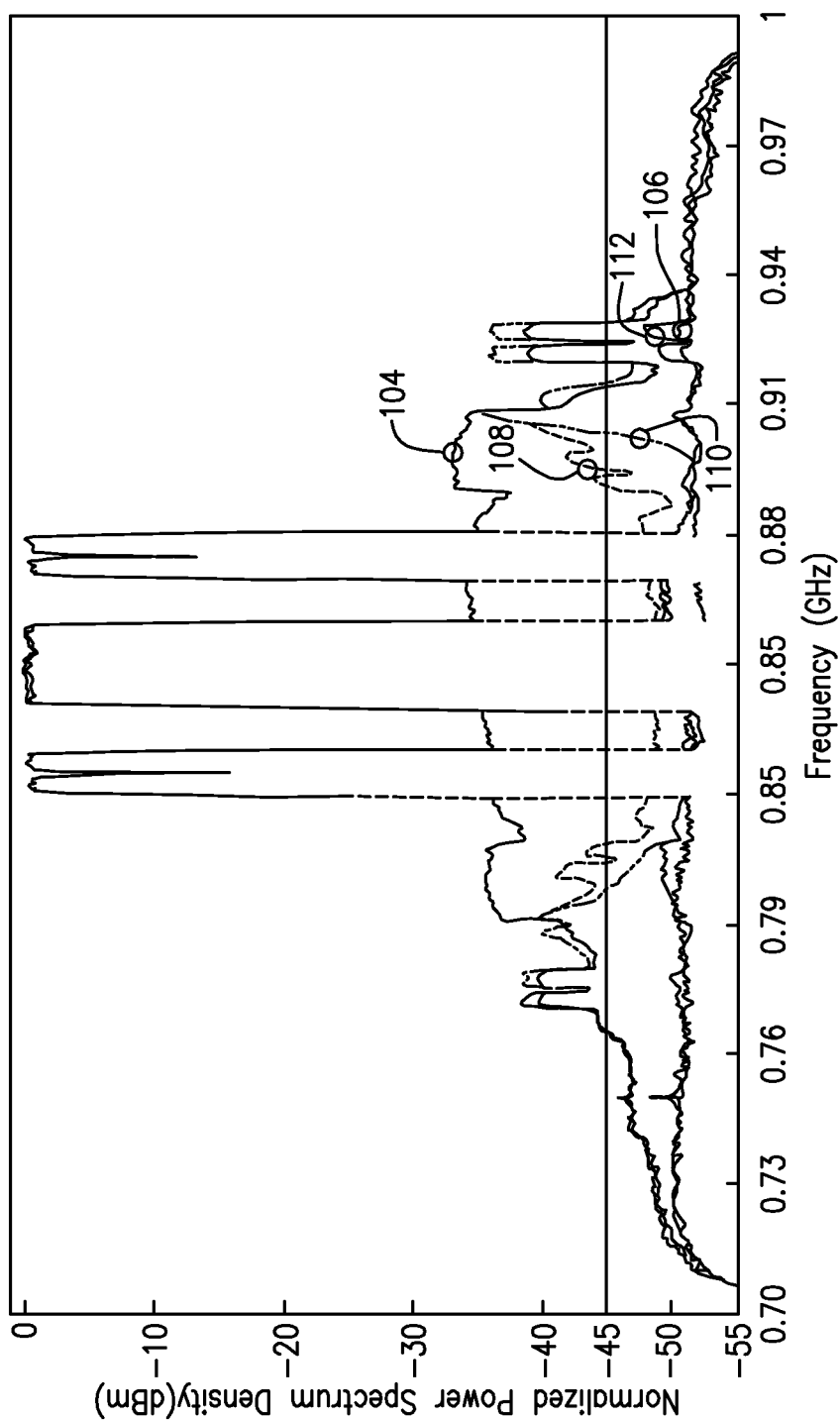
FIG. 18. is a plot of the output spectra of a GaN Doherty power amplifier driven with a 60 MHz bandwidth mixed LTE and WCDMA signal, with TOR sampling at 2×INR.

To demonstrate the applicability of the DPD with reduced TOR bandwidth and high transmit path sampling rate to wide-band signals, a 60 MHz bandwidth signal was used, namely a mixed LTE and WCDMA signal as given in FIG. 18 for a GaN Doherty PA. The PAPR of the signal was 10.5 dB and the PA was driven to a 2 dB compression point. The PA carrier frequency was set to 850 MHz. FIG. 18 shows the PA output spectra with and without DPDs. The different DPD schemes, shown in Table I, were used to linearize the PA and the results are reported in FIG. 18 for the TOR sampling rate being 2×INR. FIG. 18 is a plot of the PA output spectra resulting from no DPD (curve 104), resulting from a conventional DPD with full bandwidth (curve 106), resulting from a conventional DPD with limited bandwidth (curve 108), resulting from a band-limited Volterra series (curve 110), and resulting from the DPD with RTB/HTPSR (curve 112).

Figure 19:
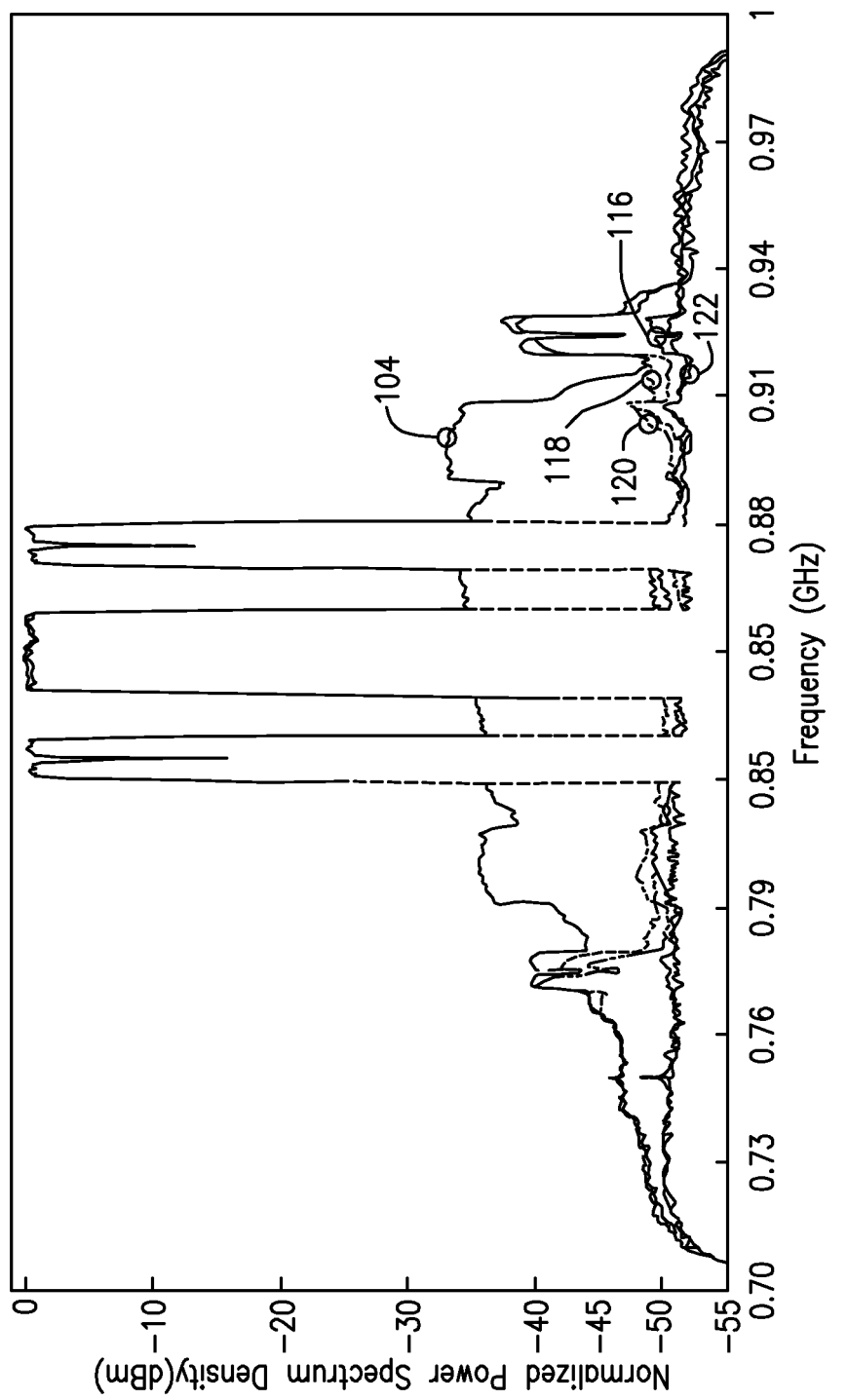
FIG. 19 is a plot of the output spectra of a GaN Doherty power amplifier driven with a 60 MHz bandwidth mixed LTE and WCDMA signal, with TOR sampling at 2.5×INR.

FIG. 19 is a plot of the PA output spectra when the TOR ADC 25 sampling rate is 2.5×INR. Thus, FIG. 19 shows the PA output spectrum resulting from no DPD (curve 104), resulting from a conventional DPD with full bandwidth (curve 116), resulting from a conventional DPD with limited bandwidth (curve 118), resulting from a band-limited Volterra series (curve 120), and resulting from the DPD with RTB/HTPSR (curve 122).

Table III shows the error vector magnitude (EVM) of the output of the two PAs under test for a modulated input signal of 20 MHz and of 60 MHz.

TABLE III

Error Vector Magnitude at the Output Signal of the Two PAs under test

| | | Signal Type | |
|---|---|---|---|
| Model Type | | 20 MHz | 60 MHz |
| Without DPD | | −20.92 | −21.39 |
| Conv DPD with Full Bandwidth | (5.0 × INR) | −41.93 | −38.64 |
| Conv DPD with Limited Bandwidth | (2.0 × INR) | −29.01 | −33.66 |
| Conv DPD with Limited Bandwidth | (2.5 × INR) | −35.29 | −35.32 |
| Band-Limited Volterra series DPD | (2.0 × INR) | −29.96 | −34.29 |
| Band-Limited Volterra series DPD | (2.5 × INR) | −35.70 | −37.15 |
| DPD with RTB/HTPSR | (2.0 × INR) | −39.13 | −34.31 |
| DPD with RTB/HTPSR | (2.5 × INR) | −39.93 | −37.54 |

Table IV shows the measured ACLR at the output of the GaN Doherty PA driven with a 60 MHz mixed LTE signal for a TOR sampling rate of 2×INR and 2.5×INR.

TABLE IV

Measured Adjacent Channel Leakage Ratio at the Output of the GaN Doherty PA driven with 60 MHz Mixed LTE Signal

| | | Offset | |
|---|---|---|---|
| Model Type | | 45 MHz | 75 MHz |
| Without DPD | | −35.49 | −35.49 |
| Conv DPD with Full Bandwidth | (5.0 × INR) | −49.44 | −51.25 |
| Conv DPD with Limited Bandwidth | (2.0 × INR) | −41.41 | −38.75 |
| Conv DPD with Limited Bandwidth | (2.5 × INR) | −49.17 | −42.92 |
| Band-Limited Volterra series DPD | (2.0 × INR) | −46.90 | −38.75 |
| Band-Limited Volterra series DPD | (2.5 × INR) | −48.75 | −43.75 |
| DPD with Reduced TOR Bandwidth | (2.0 × INR) | −50.70 | −50.00 |
| DPD with Reduced TOR BW | (2.5 × INR) | −50.83 | −50.83 |

FIGS. 18 and 19 show that the conventional DPD with full bandwidth linearized the output spectrum less than about −50 dBc along the 300 MHz bandwidth Similar to the previous experiments, the conventional DPD with limited bandwidth failed to linearize the output spectrum PA outside the observed band and showed limited linearization within the observed band. The band-limited Volterra series succeeded in linearizing the PA within the observed band but did not improve spectrum regrowth beyond 120 MHz (outside the observed band). However, it is clear from FIGS. 18 and 19 and Table IV, that the DPD with reduced TOR bandwidth and high sampling rate in the transmit path linearized the output of the PA for the entire 300 MHz bandwidth at about 50 dBc. Therefore, using only reduced ADC speed in the TOR path while maintaining high DAC speed in the transmit path, the DPD with reduced TOR bandwidth was able to show performance similar to the conventional DPD with full bandwidth of the TOR.

The DPD with reduced TOR bandwidth and high sampling in the transmit path resulted in an EVM of about −35 dB. It can be concluded therefore, that the proposed technique to identify the DPD parameters is successful at fully linearizing the PA output IMDs even though only limited spectrum is observed at the output of the PA. Unlike the band-limited Volterra series, where a band-pass filter is necessary to remove the remaining out-of-band distortion, the DPD with reduced TOR bandwidth and high sampling rate in the transmit path does not involve such additional linearization steps.

When the sampling rate in the TOR was increased to 2.5× INR, in an effort to improve the linearization performances of the DPD models, FIG. 19 shows that the DPD with reduced TOR bandwidth with high sampling rate in the transmit path matches the conventional DPD with full bandwidth in both EVM and ACPR (as shown in Table III and IV). The band-limited Volterra series and conventional DPD were still not linearizing outside the observed band and the band-limited conventional DPD had poor linearization even within the 150 MHz observed band.

Thus, a technique for reducing the transmitter observation receiver bandwidth has been described, showing that a transmitter observation receiver may operate at a reduced sample rate, while maintaining a high sampling rate in the transmit path, to achieve linearization within and outside the observed bandwidth. Simulation and measurement results with multi-tone and modulated signals prove the feasibility and robustness of the proposed technique with narrow and wideband signals. Linearization of different nonlinear PA topologies can be achieved within and outside of the observation band when the DAC of the transmit path operates at a rate that is at least about 5 times the Nyquist rate of the modulated input signal and when the TOR ADC samples at a rate that is about 2 times the Nyquist rate of the modulated input signal. The model's performance was compared with that of the band-limited Volterra series, and conventional DPDs with full and limited bandwidth. The above-described technique showed comparable results to the conventional DPD with full bandwidth while using a RTB/HTPSR approach. In addition, the proposed technique outperformed the band-limited Volterra series, as linearization is also possible outside of the observed bandwidth with the RTB/HTPSR approach.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A method of generating digital pre-distorter, DPD, parameters, the method comprising iteratively updating parameters of a digital pre-distorter, DPD by:
   (a) generating a DPD output signal based on a modulated input signal, the DPD using a set of parameters;
   (b) converting the DPD output signal to an analog signal using a digital-to-analog converter operating at a rate of at least 5 times a Nyquist rate of the modulated input signal, the digital-to-analog converter producing an analog output signal;
   (c) amplifying the analog output signal via a power amplifier to produce a power amplifier output signal;
   (d) sampling the power amplifier output in a transmitter observation receiver, TOR, at a rate that is about 2 times the Nyquist rate of the modulated input signal to produce an observation signal;

(e) generating a next set of parameters of the DPD via a DPD parameter determiner, the next set of parameters of the DPD derived from the observation signal and the DPD output signal; and (f) repeating steps (a) through (e) using the next set of parameters of step (e) in step (a) until a response of the power amplifier is linearized without substantial spectral regrowth throughout a frequency band defined by more than twice the bandwidth of the modulated input signal;

a first set of parameters used in step (a) in a first iteration being based on a Volterra series pruned using G-functionals chosen to ultimately achieve substantial linearization of a response of the power amplifier over a number of iterations of steps (a) through (e) subject to a constraint that the power amplifier output is sampled in the TOR at a rate that does not exceed about 2 times the Nyquist rate of the modulated input signal.

2. The method of claim 1, wherein a spectrum of the power amplifier output is band limited in the TOR to about twice the bandwidth of the modulated input signal.

3. The method of claim 1, wherein the digital-to-analog filter is operated at a sample rate that is at least 5 times the Nyquist rate of the modulated input signal.

4. The method of claim 2, wherein the band limited power amplifier output is sampled at a rate that is about twice the Nyquist rate of the modulated input signal.

5. A method of generating digital pre-distortion, DPD, function parameters for pre-distortion of input signals of a power amplifier having a non-linear behavior, the method comprising:

(a) initializing a digital pre-distorter, DPD, to operate with an initial set of DPD function parameters;

(b) exciting the DPD, with a modulated input signal having a bandwidth to produce a DPD output signal having distortion lying within and outside a frequency range defined by the bandwidth of the modulated input signal;

(c) converting the DPD output signal to an analog signal via a digital-to-analog converter operating at a sample rate of at least 5 times a Nyquist rate of the modulated input signal;

(d) up-converting the analog signal;

(e) amplifying the up-converted analog signal via the power amplifier to produce a power amplifier output signal;

(f) producing an observation signal in a transmitter observation receiver, TOR, based on the power amplifier output, the observation signal being sampled at a rate that is about 2 times the Nyquist rate of the modulated input signal;

(g) up-sampling the observation signal to match a sampling rate of the DPD output signal; and (h) generating subsequent DPD function parameters based on the up-sampled observation signal and the DPD output signal;

(i) setting the DPD to operate with the subsequent DPD function parameters; and (j) repeating steps (b) through (i) until a response of the power amplifier is linearized without substantial spectral regrowth throughout a frequency band defined by more than twice the bandwidth of the modulated input signal;

the initial set of DPD function parameters being based on a Volterra series pruned using G-functionals chosen to ultimately achieve substantial linearization of a response of the power amplifier over a number of iterations of steps (a) through (i) subject to a constraint that the power amplifier output is sampled in the TOR at a rate that does not exceed about 2 times the Nyquist rate of the modulated input signal.

6. The method of claim 5, wherein the digital pre-distorter is initialized by applying an input comprising multiple discrete tones.

7. The method of claim 5, further comprising band limiting, via the TOR, a spectrum of the power amplifier output to produce an observation signal having a bandwidth of about twice the bandwidth of the input signal.

8. The method of claim 5, wherein the TOR has an analog to digital converter that operates at a sample rate that is about twice the Nyquist rate of the modulated input signal.

9. The method of claim 6, wherein the multiple discrete tones are unevenly spaced.

10. A power amplification system, comprising:

a digital pre-distorter (DPD) configured to pre-distort a modulated input signal having a first bandwidth and to produce a digital pre-distorter output signal having distortion lying within and outside a frequency range defined by the first bandwidth, the DPD being initialized to operate with an initial set of DPD parameters;

a digital-to-analog converter operating a sampling rate of at least 5 times a Nyquist rate of the modulated input signal to produce an analog signal;

an up-converter configured to up-convert the analog signal;

a power amplifier configured to amplify the analog signal to produce a power amplifier output signal, the power amplifier output signal having a nonlinear amplification of the digital pre-distorter output signal;

a transmitter observation receiver having an analog to digital converter configured to operate at a sampling rate that is about 2 times a Nyquist rate of the modulated input signal to produce an observation signal;

an up-sampler configured to up-sample the observation signal to match a sampling rate of the digital pre-distorter; and a parameter determiner configured to determine parameters of the digital pre-distorter based on the observation signal and on an output of the digital pre-distorter and to submit the parameters to the DPD;

the initial set of DPD parameters being based on a Volterra series pruned using G-functionals chosen to achieve substantial linearization of a response of the power amplifier over a number of iterations without substantial spectral regrowth throughout a frequency band defined by more than twice the bandwidth of the modulated input signal, subject to a constraint that the power amplifier output is sampled in the TOR at a rate that does not exceed about 2 times the Nyquist rate of the modulated input signal.

11. The power amplification system of claim 10, wherein the process of feeding back the determined parameters to the digital pre-distorter continues so that the response of the power amplifier is linearized over a frequency band that is about five times the first bandwidth.

12. A power amplification system, comprising:

a digital pre-distorter, DPD, configured to generate a DPD output signal based on a modulated input signal, the DPD initially using a set of first DPD parameters;

a digital-to-analog converter operating at a sampling rate at least about 5 times a Nyquist rate of the modulated input signal configured to sample the DPD output signal to produce an analog signal a power amplifier configured to amplify the analog signal to produce a power amplifier output signal;

a transmitter observation receiver, TOR, configured to sample the power amplifier output signal at a rate that is about 2 times the Nyquist rate of the modulated input signal to produce an observation signal; and a DPD parameter generator configured to generate a next set of DPD parameters based on the observation signal and the DPD output signal and to submit the next set of DPD parameters to the DPD;

the first set of DPD parameters being based on a Volterra series pruned using G-functionals chosen to achieve substantial linearization of a response of the power amplifier over a number of iterations without substantial spectral regrowth throughout a frequency band defined by more than twice the bandwidth of the modulated input signal, subject to a constraint that the power amplifier output signal is sampled in the TOR at a rate that does not exceed about 2 times the Nyquist rate of the modulated input signal.

13. The power amplification system of claim 12, wherein the next set of DPD parameters are updated and coupled to the DPD iteratively so that linearization of the power amplifier is achieved over a frequency band that is about 2 times the bandwidth of the modulated input signal.

14. The power amplification system of claim 12, wherein the transmitter observation receiver is configured to band limit a spectrum of the power amplifier to an observation bandwidth that is about equal to twice the bandwidth of the modulated input signal.

* * * * *

UNITED STATES PATENT AND TRADEMARK OFFICE
CERTIFICATE OF CORRECTION

PATENT NO. : 9,191,041 B2
APPLICATION NO. : 14/362213
DATED : November 17, 2015
INVENTOR(S) : Mkadem et al.

Page 1 of 1

It is certified that error appears in the above-identified patent and that said Letters Patent is hereby corrected as shown below:

IN THE SPECIFICATION

In Column 17, Line 52, delete "bandwidth" and insert -- bandwidth. --, therefor.

IN THE CLAIMS

In Column 20, Line 65, in Claim 12, delete "signal" and insert -- signal; --, therefor.

Signed and Sealed this
Fifth Day of April, 2016

Michelle K. Lee
*Director of the United States Patent and Trademark Office*